(12) United States Patent
Yamazaki et al.

(10) Patent No.: US 9,165,991 B2
(45) Date of Patent: Oct. 20, 2015

(54) DISPLAY DEVICE

(71) Applicant: SEMICONDUCTOR ENERGY LABORATORY CO., LTD, Atsugi-shi, Kanagawa-ken (JP)

(72) Inventors: Shunpei Yamazaki, Tokyo (JP); Satoshi Murakami, Tochigi (JP); Mitsuaki Osame, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/588,771

(22) Filed: Jan. 2, 2015

(65) Prior Publication Data

US 2015/0108515 A1 Apr. 23, 2015

Related U.S. Application Data

(60) Continuation of application No. 14/204,342, filed on Mar. 11, 2014, now Pat. No. 8,927,994, which is a continuation of application No. 13/922,920, filed on Jun. 20, 2013, now Pat. No. 8,748,895, which is a (Continued)

(30) Foreign Application Priority Data

May 13, 2002 (JP) ................................ 2002-137249

(51) Int. Cl.
*H01L 29/04* (2006.01)
*H01L 27/32* (2006.01)
(Continued)

(52) U.S. Cl.
CPC ........ *H01L 27/3258* (2013.01); *H01L 27/1214* (2013.01); *H01L 27/1248* (2013.01);
(Continued)

(58) Field of Classification Search
CPC . H01L 51/5253; H01L 51/56; H01L 27/3244; H01L 27/3258; H01L 51/5246
USPC ................ 257/40, 59, 72, E21.413, E21.414, 257/E29.117
See application file for complete search history.

(56) References Cited

U.S. PATENT DOCUMENTS

| 5,313,076 A | 5/1994 | Yamazaki et al. |
| 5,414,442 A | 5/1995 | Yamazaki et al. |

(Continued)

FOREIGN PATENT DOCUMENTS

| EP | 0603866 A | 6/1994 |
| EP | 0838714 A | 4/1998 |

(Continued)

OTHER PUBLICATIONS

Korean Office Action (Application No. 2003-0029301) Dated Jun. 15, 2009.

*Primary Examiner* — Andy Huynh
(74) *Attorney, Agent, or Firm* — Nixon Peabody LLP; Jeffrey L. Costellia

(57) ABSTRACT

Disclosed is a display device and an electronic apparatus incorporating the display device. The display device includes a transistor and a planarization film over the transistor. The planarization film has an opening where an edge portion is rounded. The display device further includes a first electrode over the planarization film and an organic resin film over the first electrode. The organic resin film also has an opening where an edge portion is rounded. The organic resin film is located in the opening of the planarization film. The first electrode and the transistor are electrically connected to each other through a conductive film. The first electrode is in contact with a top surface of the conductive film. Over the first electrode, a light-emitting member and a second electrode are provided.

36 Claims, 29 Drawing Sheets light emitting region

Related U.S. Application Data division of application No. 13/531,610, filed on Jun. 25, 2012, now Pat. No. 8,471,259, which is a division of application No. 13/192,596, filed on Jul. 28, 2011, now Pat. No. 8,207,537, which is a continuation of application No. 12/492,165, filed on Jun. 26, 2009, now Pat. No. 7,989,808, which is a continuation of application No. 11/137,491, filed on May 26, 2005, now Pat. No. 7,554,116, which is a division of application No. 10/426,950, filed on May 1, 2003, now Pat. No. 6,960,786.

(51) Int. Cl.
  *H01L 27/12* (2006.01)
  *H01L 51/52* (2006.01)
(52) U.S. Cl.
  CPC ........ *H01L27/3244* (2013.01); *H01L 51/5253* (2013.01); *H01L 27/326* (2013.01); *H01L 27/3246* (2013.01); *H01L 51/5237* (2013.01); *H01L 51/5271* (2013.01); *H01L 2251/5315* (2013.01)

(56) References Cited

U.S. PATENT DOCUMENTS

| | | |
|---|---|---|
| 5,459,596 A | 10/1995 | Ueda et al. |
| 5,583,369 A | 12/1996 | Yamazaki et al. |
| 5,585,949 A | 12/1996 | Yamazaki et al. |
| 5,585,951 A | 12/1996 | Noda et al. |
| 5,696,386 A | 12/1997 | Yamazaki |
| 5,733,797 A | 3/1998 | Yamaha |
| 5,784,073 A | 7/1998 | Yamazaki et al. |
| 5,818,550 A | 10/1998 | Kadota et al. |
| 5,946,561 A | 8/1999 | Yamazaki et al. |
| 5,952,708 A | 9/1999 | Yamazaki |
| 5,956,105 A | 9/1999 | Yamazaki et al. |
| 5,962,916 A | 10/1999 | Nakanishi et al. |
| 5,990,542 A | 11/1999 | Yamazaki |
| 6,037,712 A | 3/2000 | Codama et al. |
| 6,057,904 A | 5/2000 | Kim et al. |
| 6,069,443 A | 5/2000 | Jones et al. |
| 6,115,090 A | 9/2000 | Yamazaki |
| 6,130,119 A | 10/2000 | Jinnai |
| 6,136,624 A | 10/2000 | Kemmochi et al. |
| 6,150,692 A | 11/2000 | Iwanaga et al. |
| 6,169,293 B1 | 1/2001 | Yamazaki |
| 6,215,154 B1 | 4/2001 | Ishida et al. |
| 6,236,106 B1 | 5/2001 | Sato |
| 6,239,470 B1 | 5/2001 | Yamazaki |
| 6,252,297 B1 | 6/2001 | Kemmochi et al. |
| 6,265,247 B1 | 7/2001 | Nakanishi et al. |
| 6,265,730 B1 | 7/2001 | Nakanishi et al. |
| 6,271,066 B1 | 8/2001 | Yamazaki et al. |
| 6,271,543 B1 | 8/2001 | Ohtani et al. |
| 6,274,516 B1 | 8/2001 | Kamei et al. |
| 6,281,552 B1 | 8/2001 | Kawasaki et al. |
| 6,294,799 B1 | 9/2001 | Yamazaki et al. |
| 6,306,694 B1 | 10/2001 | Yamazaki et al. |
| 6,335,772 B1 | 1/2002 | Sato et al. |
| 6,344,888 B2 | 2/2002 | Yasukawa |
| 6,346,718 B1 | 2/2002 | Yamanaka et al. |
| 6,372,558 B1 | 4/2002 | Yamanaka et al. |
| 6,376,290 B1 | 4/2002 | Gosain et al. |
| 6,420,200 B1 | 7/2002 | Yamazaki et al. |
| 6,429,053 B1 | 8/2002 | Yamazaki et al. |
| 6,441,468 B1 | 8/2002 | Yamazaki |
| 6,445,059 B1 | 9/2002 | Yamazaki |
| 6,466,401 B1 | 10/2002 | Hong et al. |
| 6,492,659 B1 | 12/2002 | Yamazaki et al. |
| 6,512,504 B1 | 1/2003 | Yamauchi et al. |
| 6,515,300 B2 | 2/2003 | Boer et al. |
| 6,538,301 B1 | 3/2003 | Yamada et al. |
| 6,556,264 B1 | 4/2003 | Hirakata et al. |
| 6,562,672 B2 | 5/2003 | Yamazaki et al. |
| 6,580,094 B1 | 6/2003 | Yamazaki et al. |
| 6,583,776 B2 | 6/2003 | Yamazaki et al. |
| 6,593,592 B1 | 7/2003 | Yamazaki et al. |
| 6,593,990 B1 | 7/2003 | Yamazaki |
| 6,599,818 B2 | 7/2003 | Dairiki |
| 6,605,826 B2 | 8/2003 | Yamazaki et al. |
| 6,608,353 B2 | 8/2003 | Miyazaki et al. |
| 6,613,618 B1 | 9/2003 | Nakanishi et al. |
| 6,614,076 B2 | 9/2003 | Kawasaki et al. |
| 6,628,367 B2 | 9/2003 | Hirabayashi et al. |
| 6,630,977 B1 | 10/2003 | Yamazaki et al. |
| 6,632,708 B2 | 10/2003 | Sakama et al. |
| 6,657,230 B1 | 12/2003 | Murade |
| 6,664,145 B1 | 12/2003 | Yamazaki et al. |
| 6,664,732 B2 | 12/2003 | Yamazaki et al. |
| 6,689,492 B1 | 2/2004 | Yamazaki et al. |
| 6,706,544 B2 | 3/2004 | Yamazaki et al. |
| 6,729,922 B2 | 5/2004 | Hiroki |
| 6,730,992 B2 | 5/2004 | Sakama et al. |
| 6,739,931 B2 * | 5/2004 | Yamazaki et al. ............... 445/24 |
| 6,740,599 B2 | 5/2004 | Yamazaki et al. |
| 6,744,198 B2 | 6/2004 | Hirabayashi |
| 6,759,678 B2 | 7/2004 | Yamazaki et al. |
| 6,768,259 B2 | 7/2004 | Hirano |
| 6,774,574 B1 | 8/2004 | Koyama |
| 6,774,578 B2 | 8/2004 | Tanada |
| 6,777,710 B1 | 8/2004 | Koyama |
| 6,778,231 B1 | 8/2004 | Yamazaki et al. |
| 6,778,232 B2 | 8/2004 | Nakata et al. |
| 6,781,153 B2 | 8/2004 | Anzai |
| 6,784,457 B2 | 8/2004 | Yamazaki et al. |
| 6,787,887 B2 | 9/2004 | Yamazaki |
| 6,791,129 B2 | 9/2004 | Inukai |
| 6,794,673 B2 | 9/2004 | Gosain et al. |
| 6,800,875 B1 | 10/2004 | Yamazaki |
| 6,809,343 B2 | 10/2004 | Yamazaki et al. |
| 6,822,629 B2 | 11/2004 | Yamazaki et al. |
| 6,828,950 B2 | 12/2004 | Koyama |
| 6,867,434 B2 | 3/2005 | Yamazaki |
| 6,875,674 B2 | 4/2005 | Asami et al. |
| 6,897,608 B2 | 5/2005 | Yamazaki et al. |
| 6,933,996 B2 | 8/2005 | Yasukawa |
| 6,950,168 B2 | 9/2005 | Yamazaki et al. |
| 6,955,953 B2 | 10/2005 | Yamazaki et al. |
| 6,956,324 B2 | 10/2005 | Yamazaki |
| 6,958,251 B2 | 10/2005 | Yamazaki et al. |
| 6,960,786 B2 | 11/2005 | Yamazaki et al. |
| 6,972,263 B2 | 12/2005 | Yamazaki et al. |
| 6,975,296 B1 | 12/2005 | Yamazaki et al. |
| 7,006,177 B2 | 2/2006 | Hirakata et al. |
| 7,034,381 B2 | 4/2006 | Yamazaki |
| 7,034,456 B2 | 4/2006 | Yamazaki et al. |
| 7,038,239 B2 | 5/2006 | Murakami et al. |
| 7,068,055 B2 | 6/2006 | Hiroki |
| 7,068,246 B2 | 6/2006 | Yamazaki et al. |
| 7,087,963 B1 | 8/2006 | Suzuki |
| 7,112,817 B2 | 9/2006 | Yamazaki et al. |
| 7,126,661 B2 | 10/2006 | Yamazaki et al. |
| 7,129,917 B2 | 10/2006 | Yamazaki et al. |
| 7,151,511 B2 | 12/2006 | Koyama |
| 7,154,120 B2 | 12/2006 | Yamazaki et al. |
| 7,158,205 B2 | 1/2007 | Yasukawa |
| 7,164,155 B2 | 1/2007 | Yamazaki et al. |
| 7,184,105 B2 | 2/2007 | Yasukawa |
| 7,202,551 B2 | 4/2007 | Yamazaki |
| 7,208,394 B2 | 4/2007 | Asami et al. |
| 7,279,752 B2 | 10/2007 | Yamazaki et al. |
| 7,324,171 B2 | 1/2008 | Yasukawa |
| 7,342,251 B2 | 3/2008 | Yamazaki et al. |
| 7,361,931 B2 | 4/2008 | Yamazaki |
| 7,413,937 B2 | 8/2008 | Yamazaki |
| 7,482,182 B2 | 1/2009 | Yamazaki et al. |
| 7,532,292 B2 | 5/2009 | Yasukawa |
| 7,554,116 B2 | 6/2009 | Yamazaki et al. |
| 7,572,685 B2 | 8/2009 | Suzuki |
| 7,579,771 B2 | 8/2009 | Yamazaki et al. |
| 7,583,094 B2 | 9/2009 | Hiroki |
| 7,670,881 B2 | 3/2010 | Asami et al. |

(56) References Cited

U.S. PATENT DOCUMENTS

| | | |
|---|---|---|
| 7,675,074 B2 | 3/2010 | Yamazaki et al. |
| 7,701,541 B2 | 4/2010 | Yamazaki et al. |
| 7,727,898 B2 | 6/2010 | Yamazaki et al. |
| 7,786,496 B2 | 8/2010 | Yamazaki et al. |
| 7,804,552 B2 | 9/2010 | Yamazaki et al. |
| 7,854,640 B2 | 12/2010 | Yamazaki |
| 7,855,381 B2 | 12/2010 | Yamazaki |
| 7,868,961 B2 | 1/2011 | Yasukawa |
| 7,872,728 B1 | 1/2011 | Yasukawa |
| 7,923,269 B2 | 4/2011 | Yamazaki et al. |
| 7,989,808 B2 | 8/2011 | Yamazaki et al. |
| 8,021,204 B2 | 9/2011 | Yamazaki et al. |
| 8,107,049 B2 | 1/2012 | Yasukawa |
| 8,124,973 B2 | 2/2012 | Yamazaki et al. |
| 8,129,715 B2 | 3/2012 | Yamazaki et al. |
| 8,203,147 B2 | 6/2012 | Yamazaki |
| 8,207,537 B2 | 6/2012 | Yamazaki et al. |
| 8,304,327 B2 | 11/2012 | Asami et al. |
| 8,344,363 B2 | 1/2013 | Yamazaki et al. |
| 8,358,396 B2 | 1/2013 | Yasukawa |
| 8,471,259 B2 | 6/2013 | Yamazaki et al. |
| 8,476,623 B2 | 7/2013 | Yamazaki et al. |
| 8,525,968 B2 | 9/2013 | Yasukawa |
| 8,603,899 B2 | 12/2013 | Asami et al. |
| 8,748,895 B2 | 6/2014 | Yamazaki et al. |
| 8,772,778 B2 | 7/2014 | Yamazaki et al. |
| 2001/0005606 A1 | 6/2001 | Tanaka et al. |
| 2001/0009283 A1 | 7/2001 | Arao et al. |
| 2001/0030322 A1 | 10/2001 | Yamazaki et al. |
| 2001/0051416 A1 | 12/2001 | Yamazaki et al. |
| 2001/0053559 A1 | 12/2001 | Nagao et al. |
| 2001/0055841 A1 | 12/2001 | Yamazaki et al. |
| 2002/0004262 A1 | 1/2002 | Asami et al. |
| 2002/0036462 A1 | 3/2002 | Hirano |
| 2002/0048869 A1 | 4/2002 | Gosain et al. |
| 2002/0145116 A1 | 10/2002 | Choo et al. |
| 2002/0155706 A1 | 10/2002 | Mitsuki et al. |
| 2003/0057419 A1 | 3/2003 | Murakami et al. |
| 2003/0090447 A1 | 5/2003 | Kimura |
| 2003/0129790 A1 | 7/2003 | Yamazaki et al. |
| 2003/0189207 A1 | 10/2003 | Murakami et al. |
| 2003/0189210 A1 | 10/2003 | Yamazaki et al. |
| 2003/0189400 A1 | 10/2003 | Nishio et al. |
| 2003/0193054 A1 | 10/2003 | Hayakawa et al. |
| 2003/0197178 A1 | 10/2003 | Yamazaki et al. |
| 2003/0206332 A1 | 11/2003 | Yamazaki et al. |
| 2003/0210358 A1 | 11/2003 | Zhang et al. |
| 2004/0072380 A1 | 4/2004 | Yamazaki et al. |
| 2004/0075094 A1 | 4/2004 | Yamazaki et al. |
| 2005/0040400 A1 | 2/2005 | Yamazaki et al. |
| 2005/0052391 A1 | 3/2005 | Yamazaki et al. |
| 2005/0282305 A1 | 12/2005 | Murakami et al. |
| 2006/0077336 A1 | 4/2006 | Hirakata et al. |
| 2006/0186476 A1 | 8/2006 | Suzuki |
| 2007/0052634 A1 | 3/2007 | Yamazaki et al. |
| 2007/0139309 A1 | 6/2007 | Koyama |
| 2008/0029765 A1 | 2/2008 | Yamazaki et al. |
| 2010/0025688 A1 | 2/2010 | Murakami et al. |
| 2010/0200999 A1 | 8/2010 | Yamazaki et al. |
| 2010/0283067 A1 | 11/2010 | Murakami et al. |
| 2010/0285661 A1 | 11/2010 | Murakami et al. |
| 2012/0086042 A1 | 4/2012 | Yamazaki et al. |
| 2013/0119389 A1 | 5/2013 | Yamazaki et al. |
| 2014/0264391 A1 | 9/2014 | Yamazaki et al. |

FOREIGN PATENT DOCUMENTS

| | | |
|---|---|---|
| EP | 1065725 A | 1/2001 |
| EP | 1096571 A | 5/2001 |
| EP | 1128430 A | 8/2001 |
| EP | 1132960 A | 9/2001 |
| EP | 1382992 A | 1/2004 |
| EP | 1615275 A | 1/2006 |
| EP | 1801641 A | 6/2007 |
| EP | 1967899 A | 9/2008 |
| EP | 2270849 A | 1/2011 |
| JP | 01-156725 A | 6/1989 |
| JP | 02-039541 A | 2/1990 |
| JP | 02-234134 A | 9/1990 |
| JP | 06-242433 A | 9/1994 |
| JP | 07-056190 A | 3/1995 |
| JP | 07-273191 A | 10/1995 |
| JP | 08-203876 A | 8/1996 |
| JP | 09-197390 A | 7/1997 |
| JP | 09-219453 A | 8/1997 |
| JP | 09-223804 A | 8/1997 |
| JP | 09-265110 A | 10/1997 |
| JP | 10-039334 A | 2/1998 |
| JP | 10-056182 A | 2/1998 |
| JP | 10-062810 A | 3/1998 |
| JP | 10-068972 A | 3/1998 |
| JP | 10-303428 A | 11/1998 |
| JP | 11-064891 A | 3/1999 |
| JP | 11-102867 A | 4/1999 |
| JP | 11-163368 A | 6/1999 |
| JP | 2000-155334 A | 6/2000 |
| JP | 2000-284722 A | 10/2000 |
| JP | 2000-330129 A | 11/2000 |
| JP | 2001-033824 A | 2/2001 |
| JP | 2001-076873 A | 3/2001 |
| JP | 2001-175198 A | 6/2001 |
| JP | 2001-177101 A | 6/2001 |
| JP | 2001-189462 A | 7/2001 |
| JP | 2001-195016 A | 7/2001 |
| JP | 2001-305584 A | 10/2001 |
| JP | 2001-313397 A | 11/2001 |
| JP | 2001-318627 A | 11/2001 |
| JP | 2001-326362 A | 11/2001 |
| JP | 2001-356711 A | 12/2001 |
| JP | 2002-040455 A | 2/2002 |
| JP | 2002-050633 A | 2/2002 |
| JP | 2002-082630 A | 3/2002 |
| JP | 2002-108244 A | 4/2002 |
| JP | 2002-110995 A | 4/2002 |
| JP | 2002-117971 A | 4/2002 |
| JP | 2002-118118 A | 4/2002 |
| JP | 2002-123190 A | 4/2002 |
| JP | 2002-123218 A | 4/2002 |
| JP | 2003-017273 A | 1/2003 |
| JP | 2012-124494 A | 6/2012 |
| JP | 5376738 | 12/2013 |
| KR | 1999-0030268 A | 4/1999 |
| KR | 1999-0030269 A | 4/1999 |
| KR | 2000-0076809 A | 12/2000 |

* cited by examiner

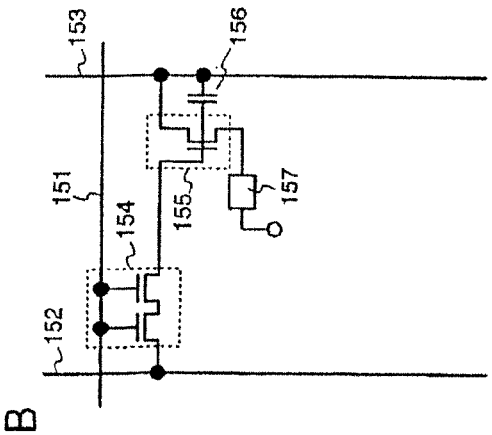
FIG. 1A
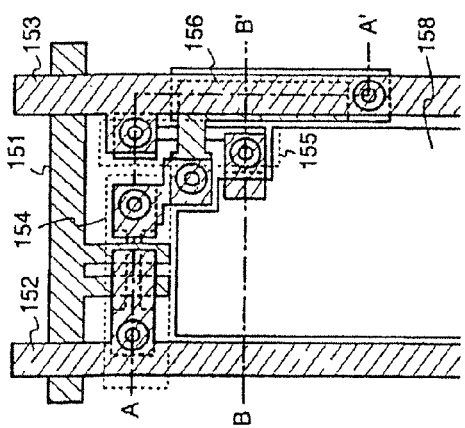
FIG. 1B
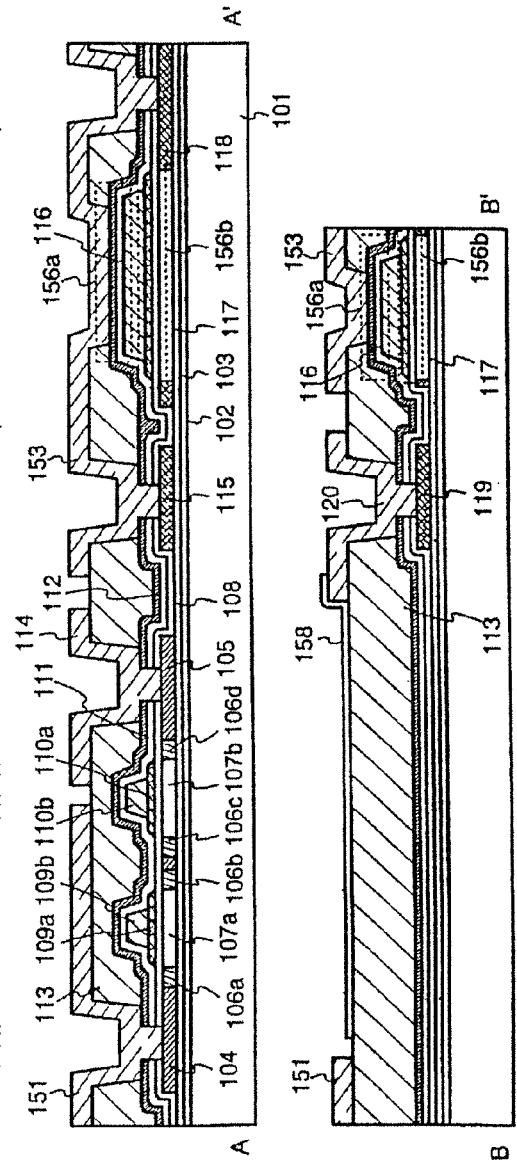
FIG. 1C
FIG. 1D

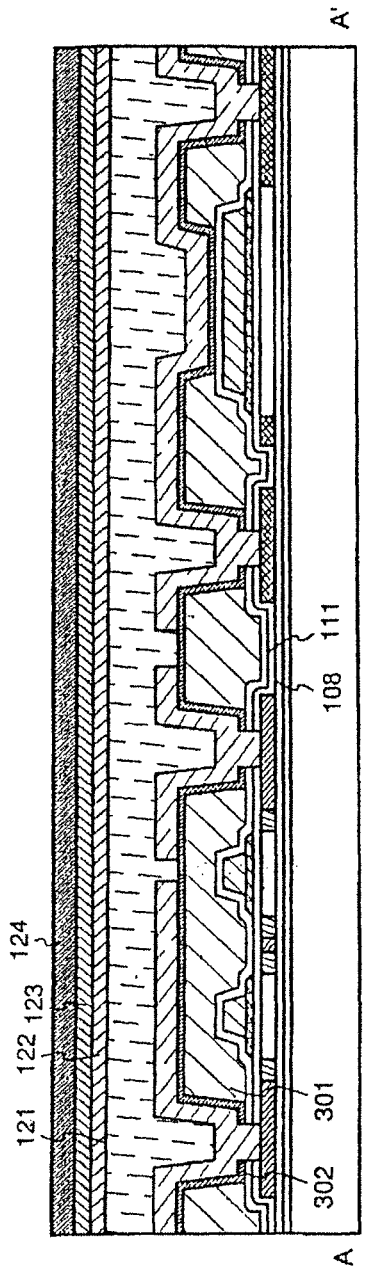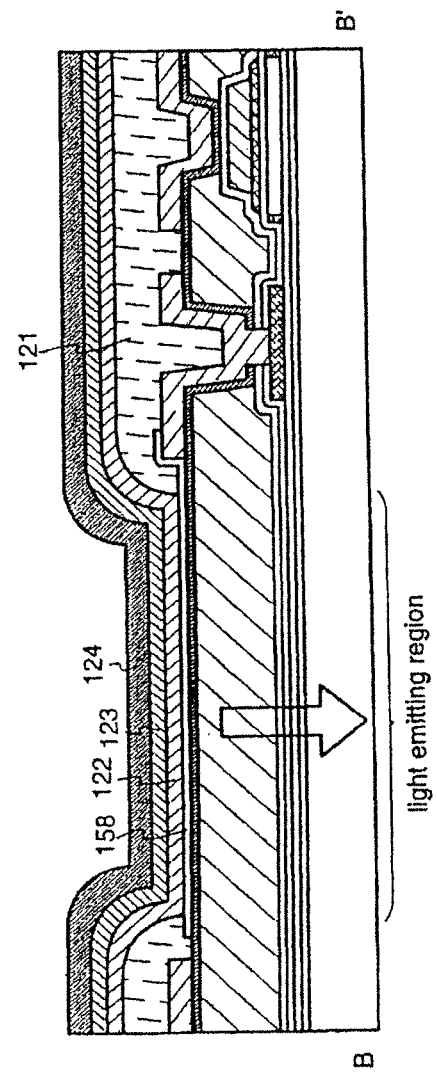
FIG. 3A
FIG. 3B

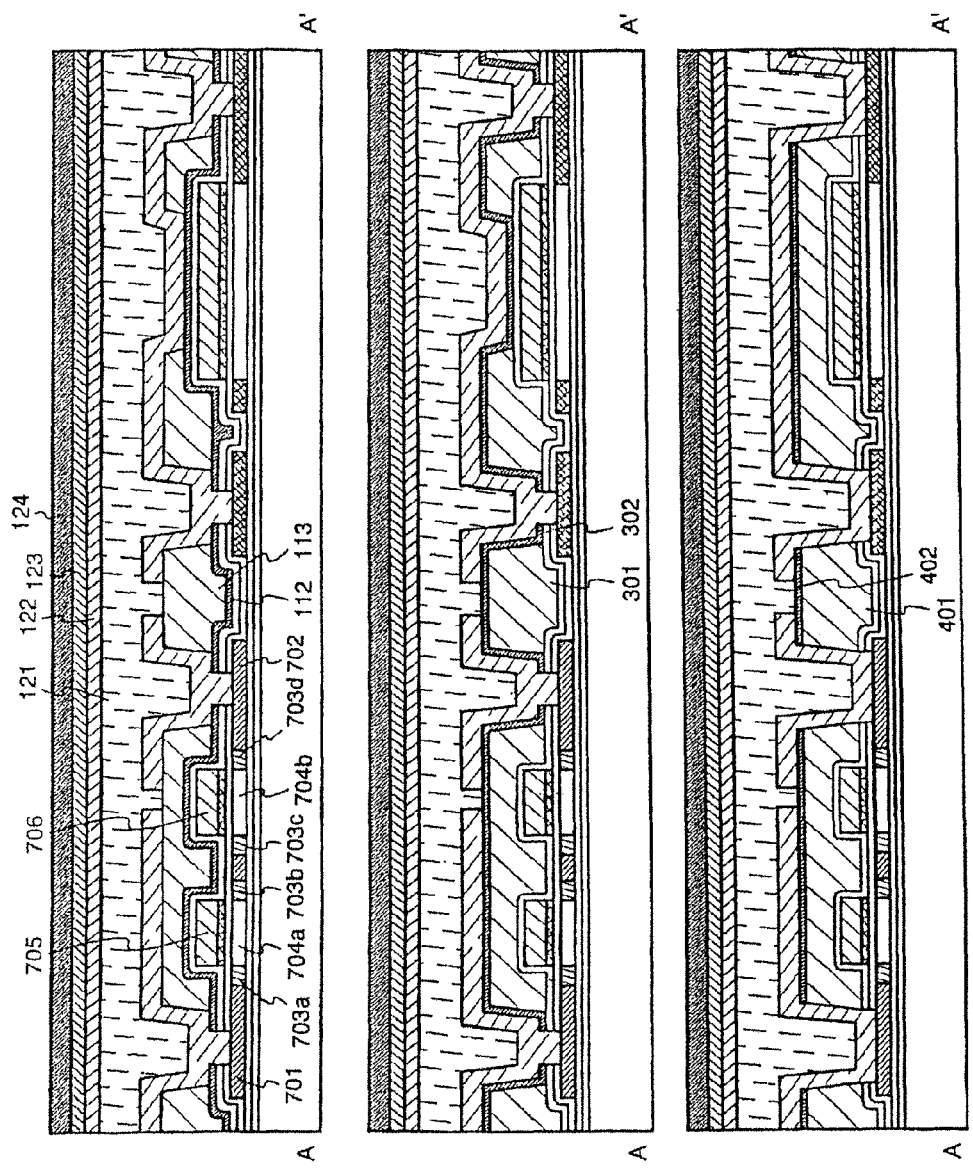

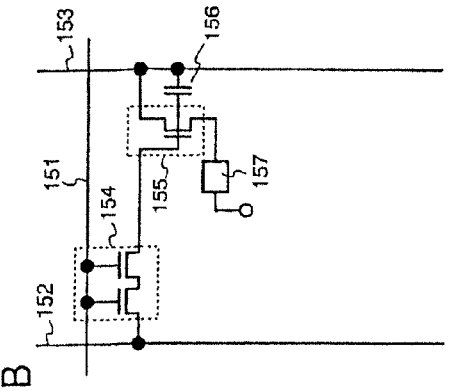
FIG. 9A
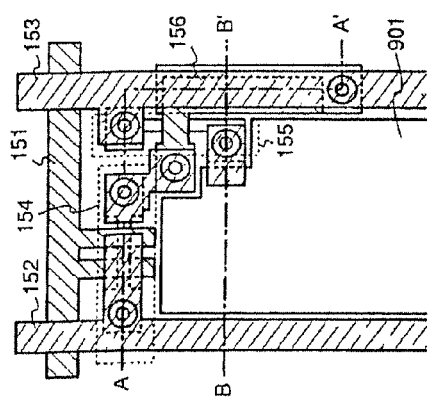
FIG. 9B
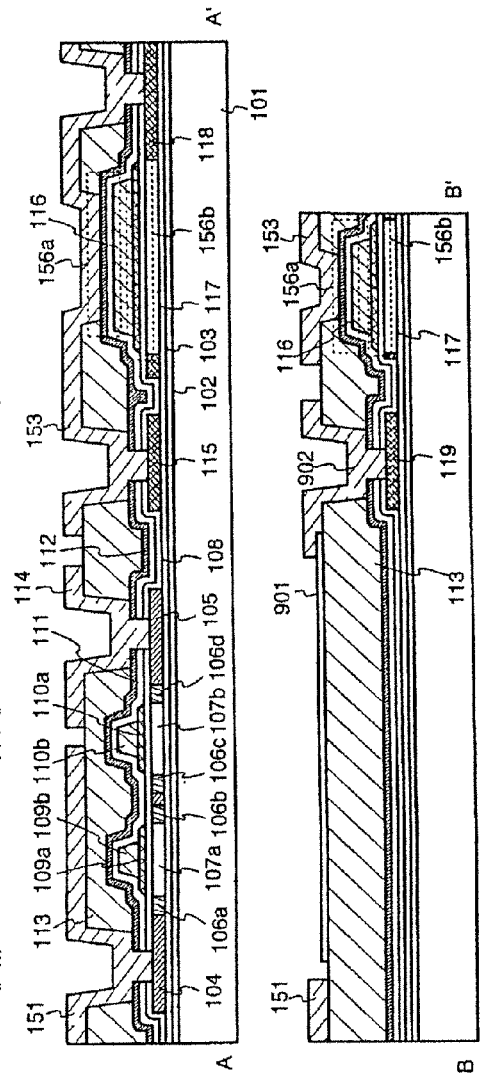
FIG. 9C
FIG. 9D

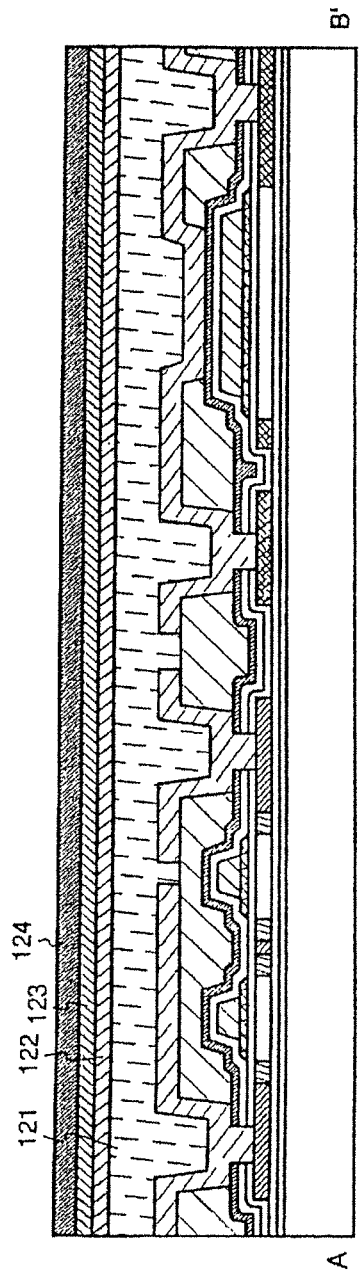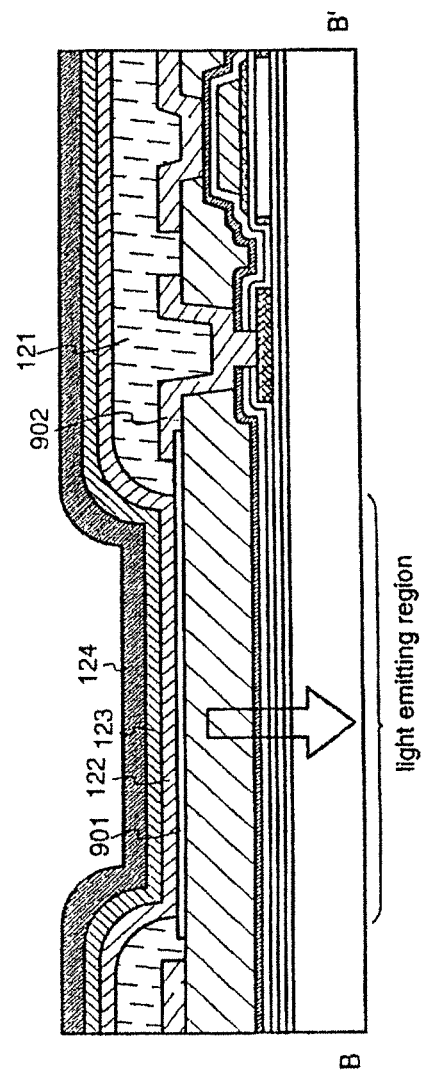
FIG. 10A
FIG. 10B

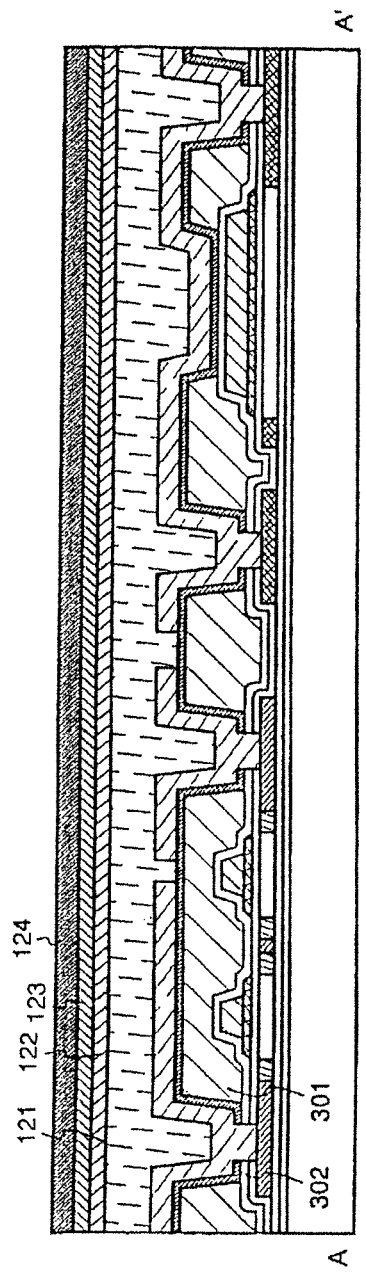
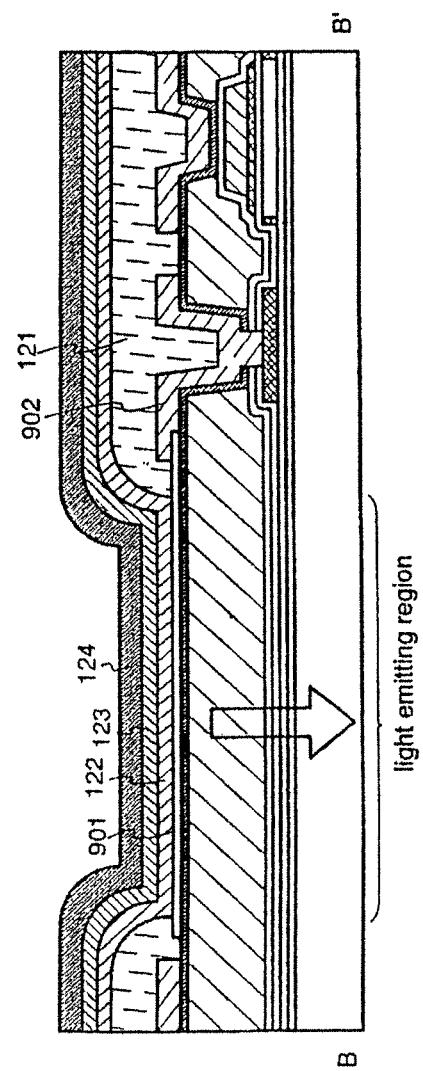
FIG. 11A
FIG. 11B

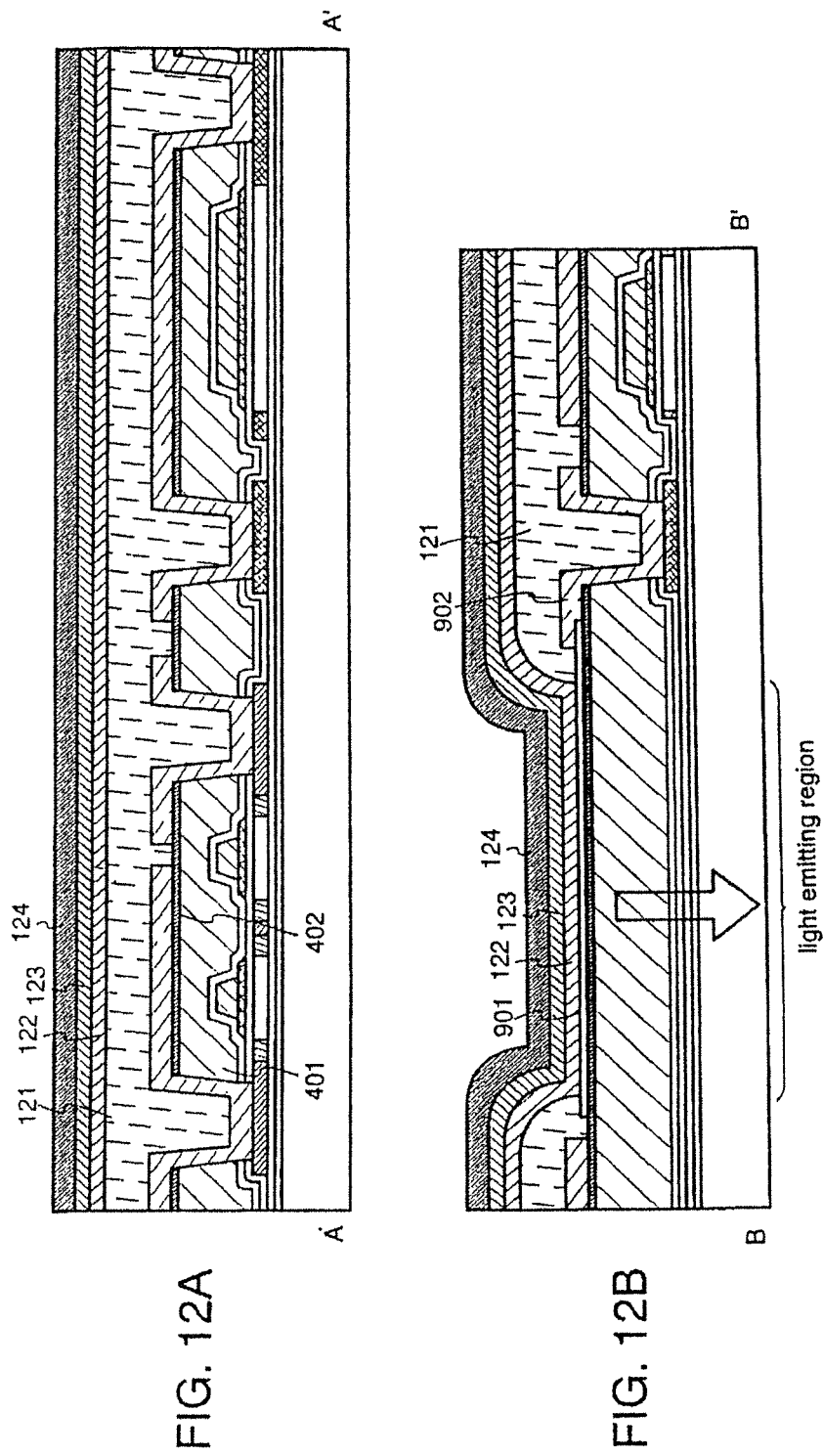

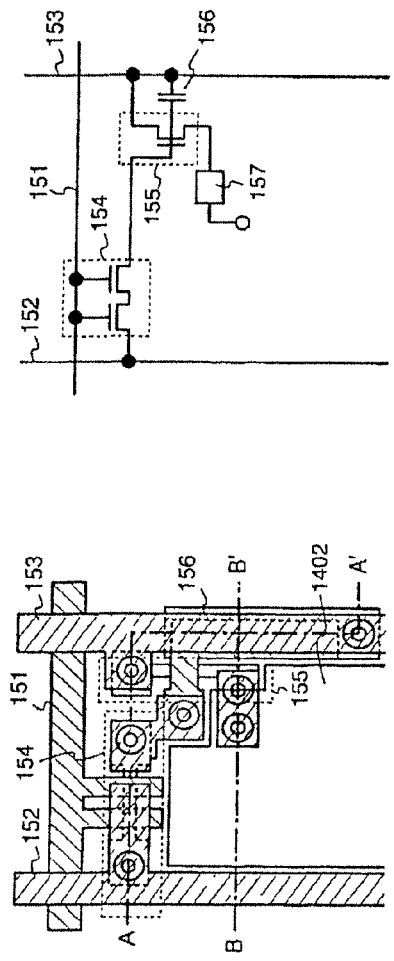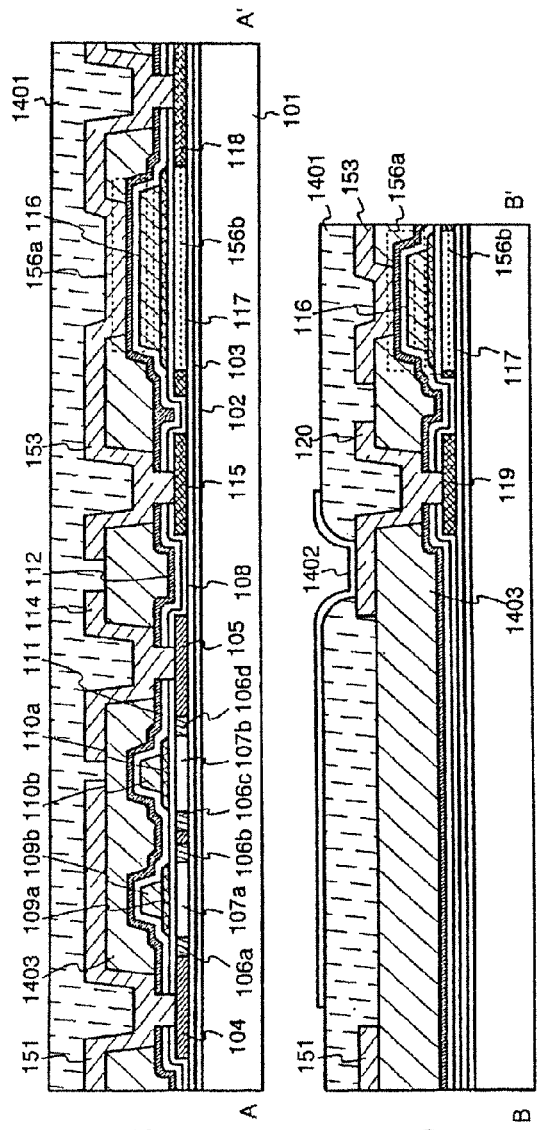
FIG. 14A
FIG. 14B
FIG. 14C
FIG. 14D

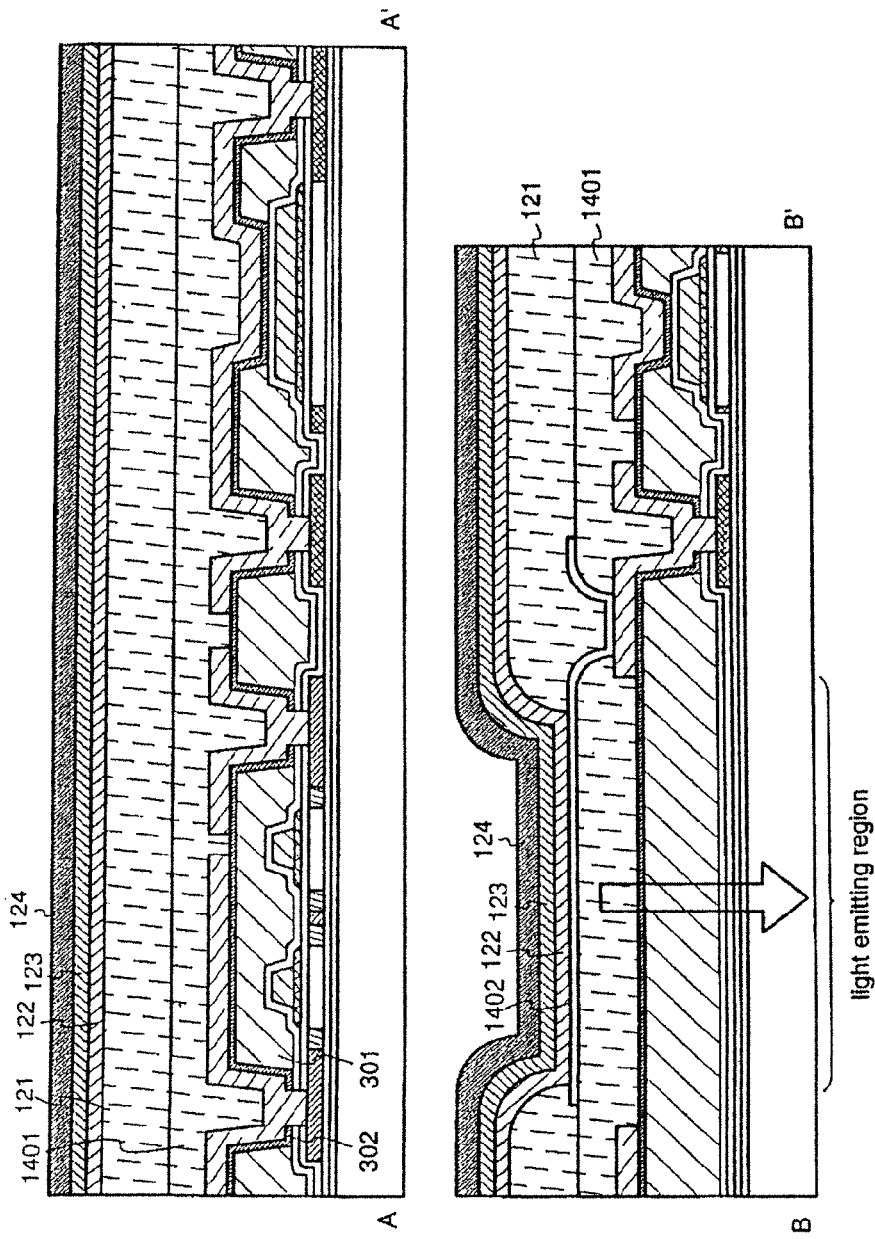

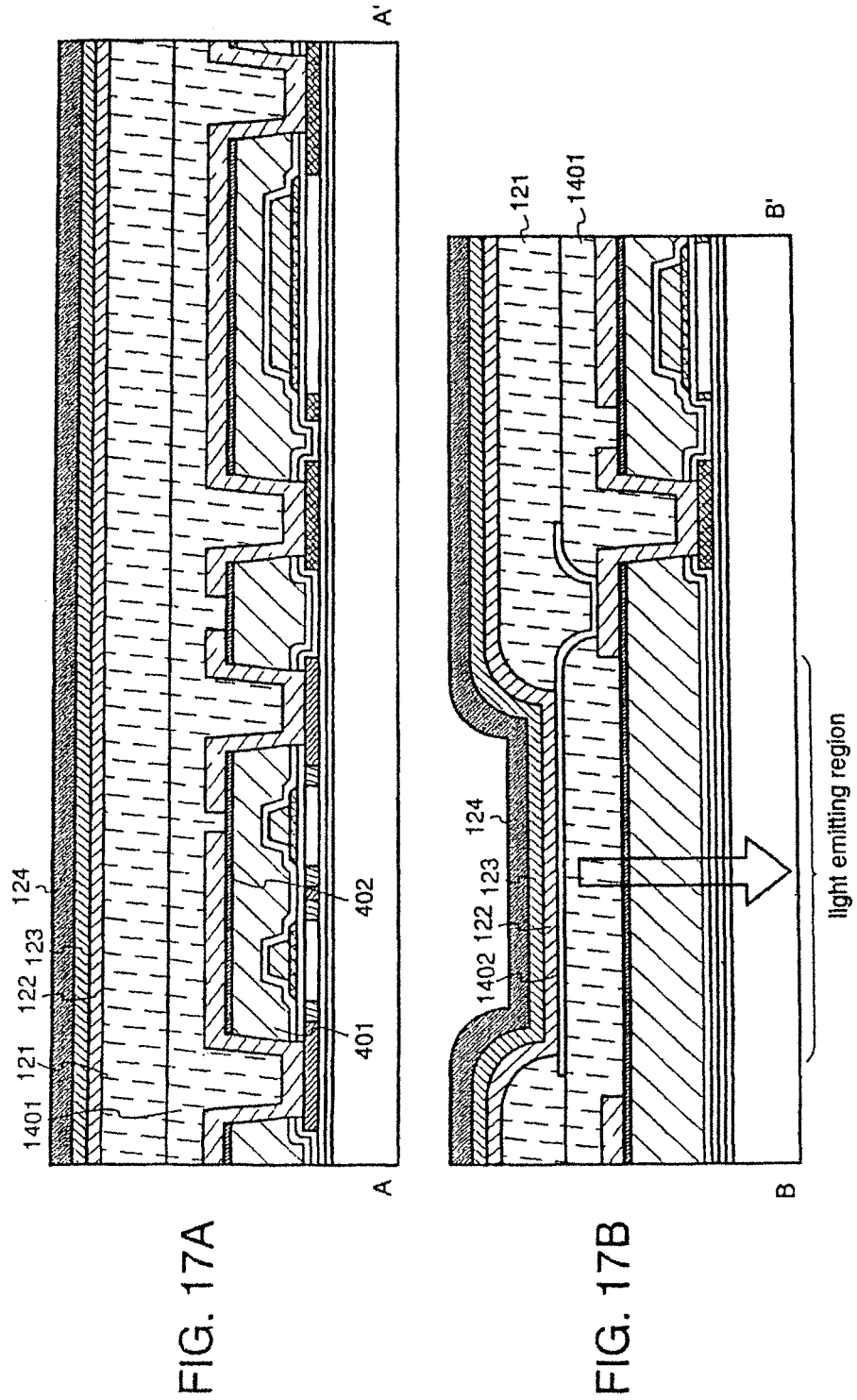

FIG. 19A
FIG. 19B
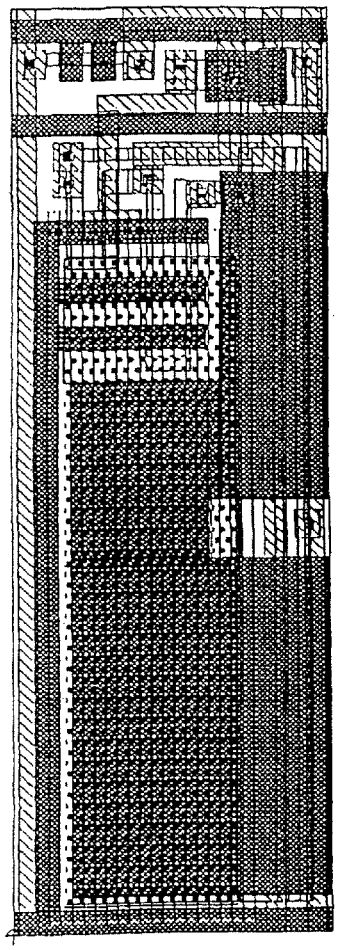
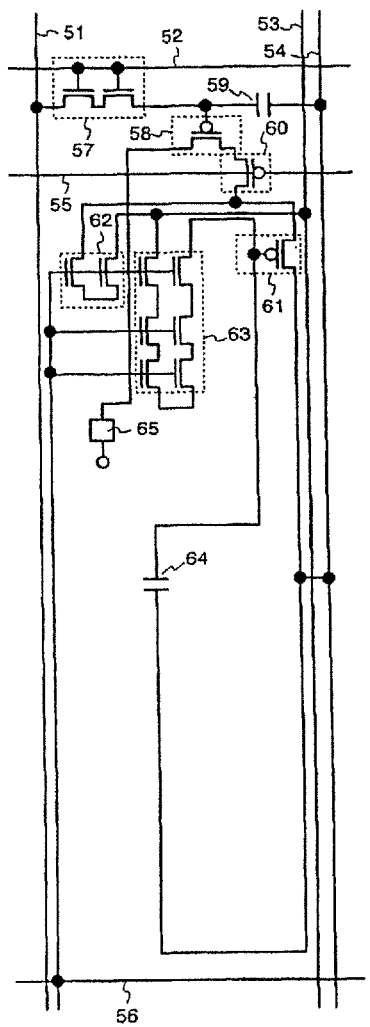
51: signal line
52: selection gate line
53: current line
54: power supply line
55: erasing gate line
56: current gate line
57: selecting transistor
58: driving transistor
59: Cs for video signal
60: erasing transistor
61: current source transistor
62: inputting transistor
63: holding transistor
64: Cs for current source
65: light emitting element

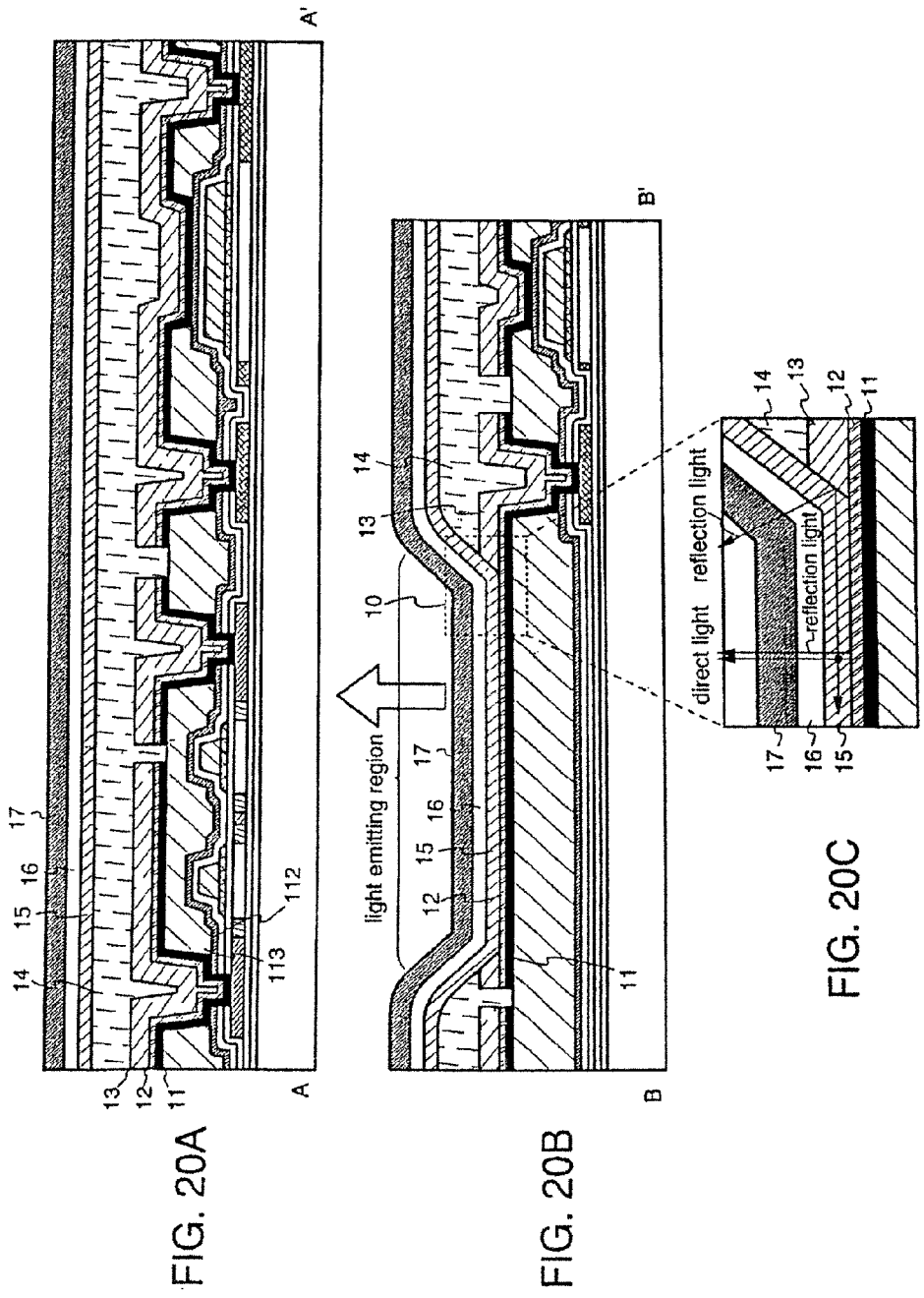

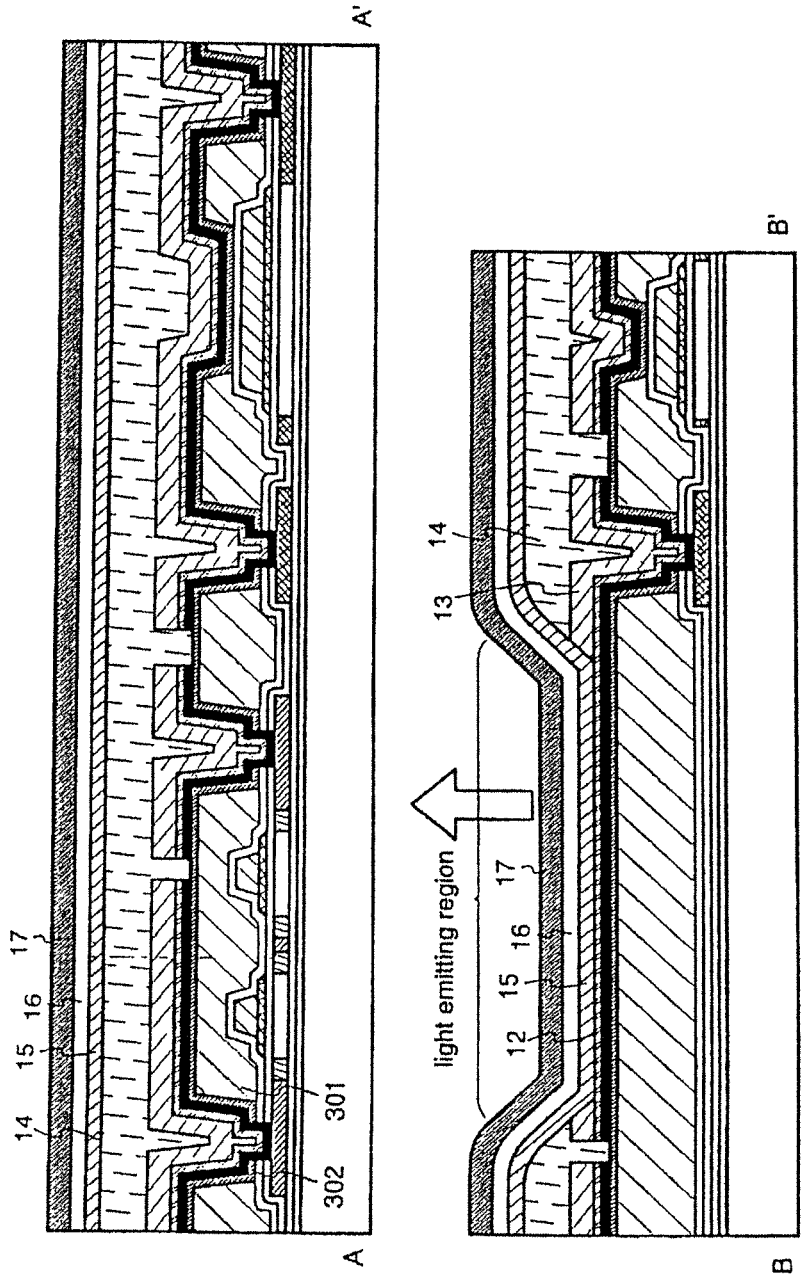

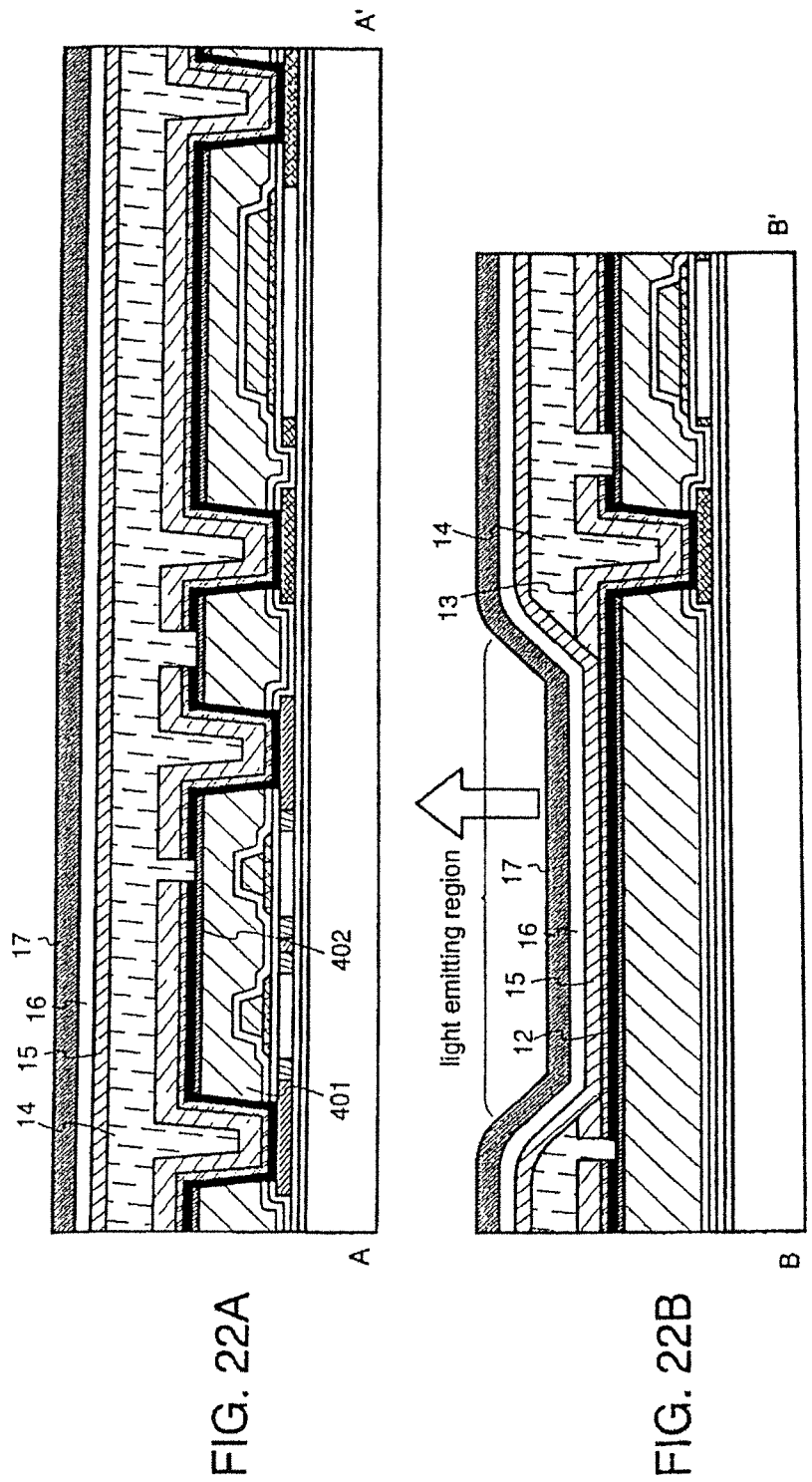

1 μm

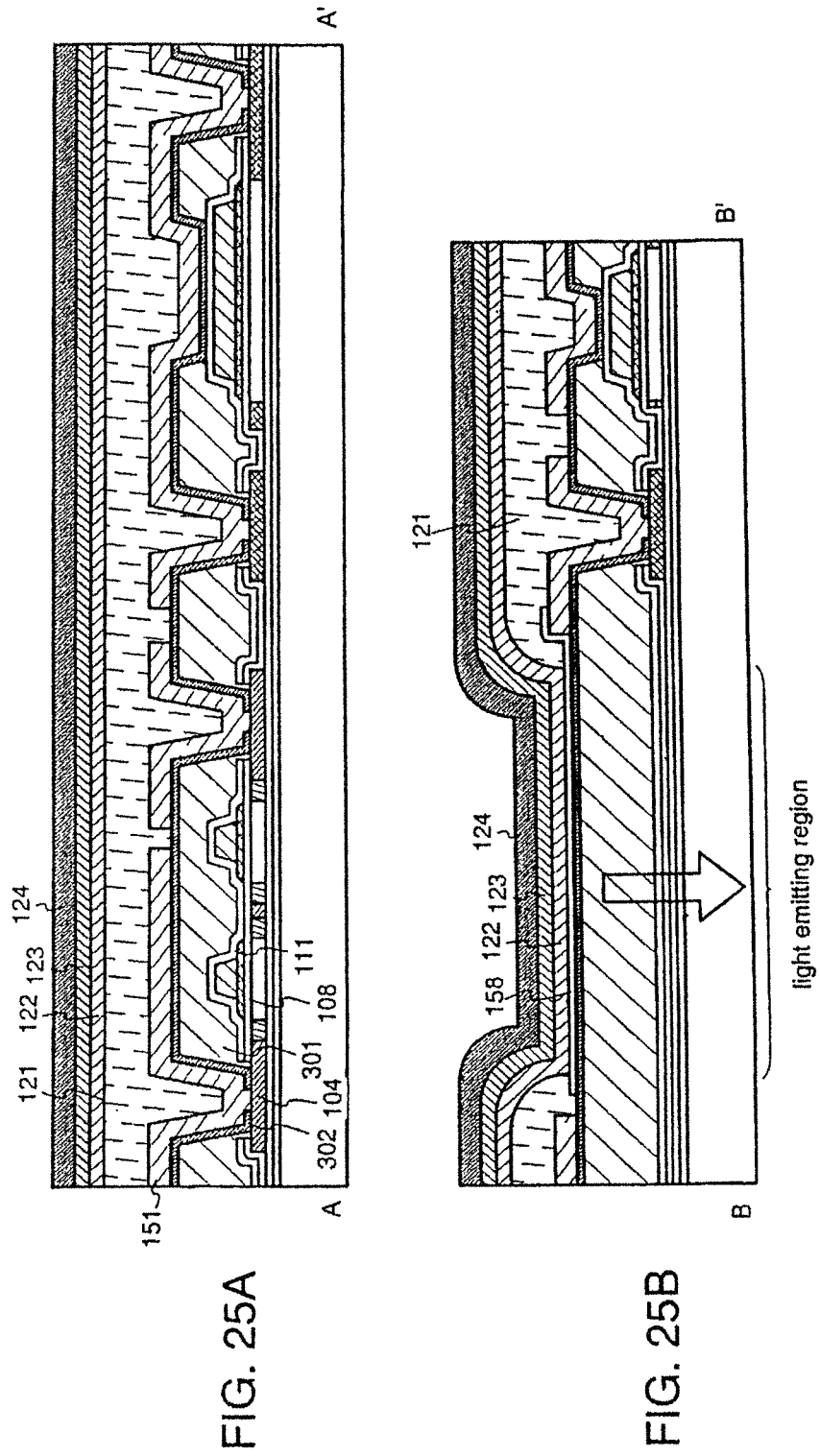

light emitting region reflection light    direct light    reflection light

FIG. 28A
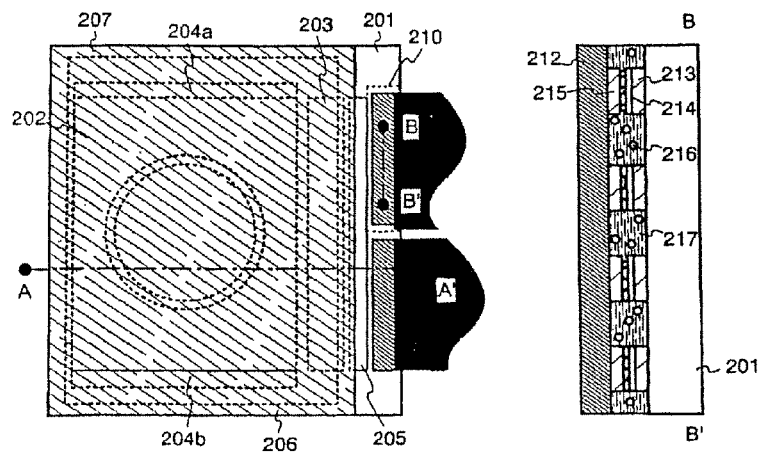
FIG. 28B
FIG. 28C
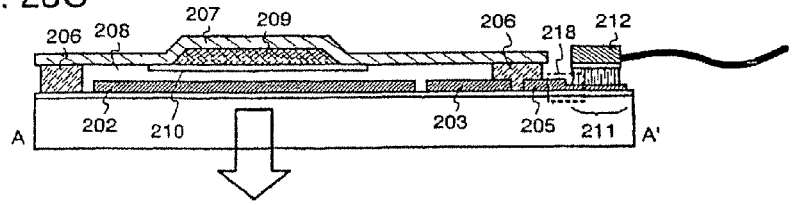
FIG. 28D
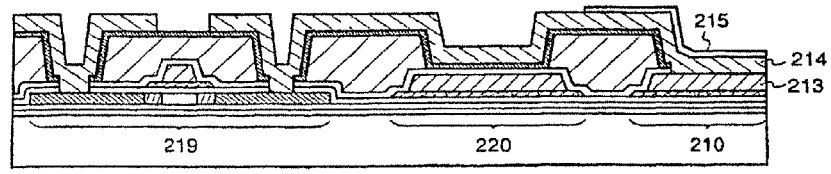

DISPLAY DEVICE

BACKGROUND OF THE INVENTION

1. Field of the Invention

The present invention belongs to a technical field related to a display device in which a semiconductor device (typically, a transistor) is used as a device, in particular, a light emitting device represented by an electroluminescence display device, and to a technical field related to an electronic apparatus equipped with the display device in an image display portion.

2. Description of the Related Art

In recent years, development of liquid crystal display devices and electroluminescence display devices in which transistors (particularly, thin film transistors) are integrated on a substrate have progressed. Such display devices are respectively characterized in that the transistors are formed on a glass substrate by using a thin film formation technique, and the transistors thus formed are disposed in pixels each arranged in matrix and made to function as a display device for image display.

A variety of specifications are conceivable, which are required for areas (hereinafter, referred to as pixel portions), in which the image display is performed in the display device. However, the following are given as examples thereof: a large number of dots and high definition are ensured; an area of an effective display region in each pixel is large and bright image display is possible; and the pixel portion involves no defects that may induce point defects or line defects in its entirety. In order to achieve those specifications, not only the performance of the transistors arranged in each pixel should be satisfactory but also a technique of forming the transistors while increasing yield through a stable process is necessary.

Further, in an organic electroluminescence display device among the electroluminescence display devices, an organic compound is used for a light emitting element serving as a light emitting source. Accordingly, a measure for suppressing deterioration of the organic compound is most highly required in ensuring its reliability. In other words, in order to achieve a highly reliable display device, attention must be paid not only to an influence of an accumulated damage in the process during manufacturing the device but also to the subsequent deterioration with time, which results from the accumulated damage.

In the above-mentioned circumstances of development) the applicants of the present invention are most concerned, in the present conditions, with problems such as variation and shift of a threshold voltage in the transistors, which arise due to the accumulation of plasma damages on an insulating film etc. in an etching process.

SUMMARY OF THE INVENTION

The present invention has been made in view of the above-mentioned problems and an object of the present invention is to provide a device structure effective in reducing an influence of plasma damage in a manufacturing process of a display device. Further, another object of the present invention is to provide a display device having uniform display characteristics (referring to display characteristics small in luminance variation between adjacent pixels and in degradation degree) obtained by reducing the influence of the plasma damage to suppress variations in threshold voltage of transistors.

The present invention relates to a display device characterized by including the following structures as a device structure effective in solving the above problems. Note that a light emitting element defined here refers to an element in which a light emitting member (referring to a laminate obtained by laminating a light emitting layer, a carrier injecting layer, a carrier transporting layer, a carrier blocking layer, and other components required for light emission, such as an organic or inorganic compound) is provided between a pair of electrodes (anode and cathode). For example, an electroluminescence element is included in the category of the light emitting element.

(1) A display device according to the present invention includes:
   a transistor formed on a substrate surface; and
   a light emitting element connected with the transistor,
   the transistor including:
   an active layer formed of a semiconductor;
   a gate insulating film formed in contact with the active layer;
   a gate electrode facing the active layer through the gate insulating film;
   a barrier layer formed above the active layer;
   a Planarization layer formed on the barrier layer; and
   a drain electrode formed on the planarization layer, the light emitting element including:
   a pixel electrode connected in contact with an upper surface of the drain electrode on the planarization layer;
   a light emitting member formed in contact with the pixel electrode; and
   an opposing electrode facing the pixel electrode through the light emitting member, and
   the drain electrode being connected with the active layer through a first opening formed in the gate insulating film and the barrier layer and a second opening formed in the planarization layer.

Note that the planarization layer of the present invention may be formed of either an inorganic insulating film or an organic resin film formed by sputtering, plasma CVD, low-pressure thermal CVD, or spin-coating. Also, when the planarization layer is formed by sputtering, plasma CVD, or low-pressure thermal CVD, its surface may be polished before the use (inclusive of polishing with a mechanical or chemical action, or a combined action thereof). By using the planarization layer, the surface of a first electrode formed on the planarization layer can be leveled and the light emitting element (EL element) can be prevented from being short-circuited. Also, by providing the barrier layer thereon, impurity diffusion from the EL element can be blocked to protect TFTs and degassing from an organic insulating film can be avoided as well. Further, by forming the barrier layer in the portion close to the active layer of the TFT, the impurity diffusion from the EL element is blocked to effectively protect the TFT.

(2) A display device according to the present invention includes:
   a transistor formed on a substrate surface; and
   a light emitting element connected with the transistor,
   the transistor including:
   an active layer formed of a semiconductor;
   a gate insulating film formed in contact with the active layer;
   a gate electrode facing the active layer through the gate insulating film;
   a planarization layer formed above the active layer;
   a barrier layer formed on the planarization layer; and
   a drain electrode formed on the barrier layer, the light emitting element including:
   a pixel electrode connected in contact with an upper surface of the drain electrode on the planarization layer;

a light emitting member formed in contact with the pixel electrode; and an opposing electrode facing the pixel electrode through the light emitting member, the drain electrode being connected with the active layer through a first opening formed in the gate insulating film and the barrier layer and a second opening formed in the planarization layer, and the barrier layer covering an upper surface of the planarization layer and a side surface of the second opening formed in the planarization layer.

Also, according to the structure stated in (2), the barrier layer is formed to thereby prevent the planarization layer from being etched in etching the first electrode and the drain electrode. Also, by covering the planarization layer with the barrier layer, the impurity diffusion from the planarization layer to the light emitting element is avoided.

(3) A display device according to the present invention includes:

a transistor formed on a substrate surface; and
a light emitting element connected with the transistor,
the transistor including:
an active layer formed of a semiconductor;
a gate insulating film formed in contact with the active layer;
a gate electrode facing the active layer through the gate insulating film;
a planarization layer formed above the active layer;
a barrier layer formed on the planarization layer; and
a drain electrode formed on the barrier layer,
the light emitting element including:
a pixel electrode connected in contact with an upper surface of the drain electrode on the planarization layer;
a light emitting member formed in contact with the pixel electrode; and
an opposing electrode facing the pixel electrode through the light emitting member, the drain electrode being connected with the active layer through an opening formed in the gate insulating film, the planarization layer, and the barrier layer, and the barrier layer covering an upper surface of the planarization layer.

Also, according to the structure stated in (3), the openings formed in the gate insulating film, the planarization layer, and the barrier layer are formed through etching by use of the same masks and can thus be formed with the smaller number of masks than that of the structure in (1) or (2).

(4) A display device according to the present invention includes:

a transistor formed on a substrate surface; and
a light emitting element connected with the transistor,
the transistor including:
an active layer formed of a semiconductor;
a gate insulating film formed in contact with the active layer;
a gate electrode facing the active layer through the gate insulating film;
a barrier layer formed above the active layer;
a planarization layer formed on the barrier layer; and
a drain electrode formed on the planarization layer,
the light emitting element including:
a pixel electrode connected in contact with a lower surface of the drain electrode on the planarization layer;
a light emitting member formed in contact with the pixel electrode; and
an opposing electrode facing the pixel electrode through the light emitting member, and the drain electrode being connected with the active layer through a first opening formed in the gate insulating film and the barrier layer and a second opening formed in the planarization layer.

(5) A display device according to the present invention includes:

a transistor formed on a substrate surface; and
a light emitting element connected with the transistor,
the transistor including:
an active layer formed of a semiconductor;
a gate insulating film formed in contact with the active layer;
a gate electrode facing the active layer through the gate insulating film;
a planarization layer formed above the active layer;
a barrier layer formed on the planarization layer; and
a drain electrode formed on the barrier layer,
the light emitting element including:
a pixel electrode connected in contact with a lower surface of the drain electrode on the planarization layer;
a light emitting member formed in contact with the pixel electrode; and
an opposing electrode facing the pixel electrode through the light emitting member, the drain electrode being connected with the active layer through a first opening formed in the gate insulating film and the barrier layer and a second opening formed in the planarization layer, and the barrier layer covering an upper surface of the planarization layer and a side surface of the second opening formed in the planarization layer.

(6) A display device according to the present invention includes:

a transistor formed on a substrate surface; and
a light emitting element connected with the transistor,
the transistor including:
an active layer formed of a semiconductor;
a gate insulating film formed in contact with the active layer;
a gate electrode facing the active layer through the gate insulating film;
a planarization layer formed above the active layer;
a harrier layer formed on the planarization layer; and
a drain electrode formed on the barrier layer,
the light emitting element including:
a pixel electrode connected in contact with a lower surface of the drain electrode on the planarization layer;
a light emitting member formed in contact with the pixel electrode; and
an opposing electrode facing the pixel electrode through the light emitting member, the drain electrode being connected with the active layer through an opening formed in the gate insulating film, the planarization layer, and the barrier layer, and the barrier layer covering an upper surface of the planarization layer.

Also, according to the structures stated in (4), (5), and (6), after forming the pixel electrode, the drain electrode is formed, so that the structures are useful in the case where the drain electrode has a large film thickness. When formed after the formation of the drain electrode, the pixel electrode is needed to partially overlap the drain electrode. When the drain electrode has a large film thickness, there is a fear that any coverage failure takes place, such as step-like breakage in the pixel electrode.

(7) A display device according to the present invention includes:
- a transistor formed on a substrate surface; and
- a light emitting element connected with the transistor,
- the transistor including:
- an active layer formed of a semiconductor;
- a gate insulating film formed in contact with the active layer;
- a gate electrode facing the active layer through the gate insulating film;
- a barrier layer formed above the active layer;
- an insulating layer formed on the barrier layer;
- a drain electrode formed on the insulating layer; and
- a planarization layer formed on a source electrode or the drain electrode,
- the light emitting element including:
- a pixel electrode formed on the planarization layer and connected with the drain electrode through an opening formed in the planarization layer;
- a light emitting member formed in contact with the pixel electrode; and
- an opposing electrode facing the pixel electrode through the light emitting member, and the drain electrode being connected with the active layer through a first opening formed in the gate insulating film and the barrier layer and a second opening formed in the insulating layer.

(8) A display device according to the present invention includes:
- a transistor formed on a substrate surface; and
- a light emitting element connected with the transistor,
- the transistor including:
- an active layer formed of a semiconductor;
- a gate insulating film formed in contact with the active layer;
- a gate electrode facing the active layer through the gate insulating film;
- an insulating layer formed above the active layer;
- a barrier layer formed on the insulating layer;
- a drain electrode formed on the barrier layer; and
- a planarization layer formed on the drain electrode,
- the light emitting element including:
- a pixel electrode formed on the planarization layer and connected with the drain electrode through an opening formed in the planarization layer;
- a light emitting member formed in contact with the pixel electrode; and
- an opposing electrode facing the pixel electrode through the light emitting member, the drain electrode being connected with the active layer through a first opening formed in the gate insulating film and the barrier layer and a second opening formed in the insulating layer, and the barrier layer covering an upper surface of the insulating layer and a side surface of the second opening formed in the insulating layer.

(9) A display device according to the present invention includes:
- a transistor formed on a substrate surface; and
- a light emitting element connected with the transistor,
- the transistor including:
- an active layer formed of a semiconductor;
- a gate insulating film formed in contact with the active layer;
- a gate electrode facing the active layer through the gate insulating film;
- an insulating layer formed above the active layer;
- a barrier layer formed on the insulating layer;
- a drain electrode formed on the barrier layer; and
- a planarization layer formed on the drain electrode,
- the light emitting element including:
- a pixel electrode formed on the planarization layer and connected with the drain electrode through an opening formed in the planarization layer;
- a light emitting member formed in contact with the pixel electrode; and
- an opposing electrode facing the pixel electrode through the light emitting member, the drain electrode being connected with the active layer through an opening formed in the gate insulating film, the insulating layer, and the barrier layer, and the barrier layer covering an upper surface of the insulating layer.

Further, according to the structures stated in (7), (8), and (9), the pixel electrode is connected with the drain electrode through a contact hole and insulated from the other wirings through the planarization layer, so that the area of the pixel electrode can be increased.

Note that, according to the structures stated in (7) to (9), the upper surface of the planarization layer may be covered with the silicon nitride film. This is because when the organic resin film is used as the planarization layer, in particular, the upper surface thereof (including an inner wall surface thereof when any opening is formed) is covered with the silicon nitride film, so that gases (including a component gas or moisture) generated from the organic resin film can be effectively prevented from diffusing to the light emitting element side.

Also, it is preferable that end portions (at least, corner portions) of the pixel electrode be covered with the resin film. This is because the electric fields are likely to concentrate in the end portion of the pixel electrode and further, coverage of the film formed thereon is poor, so that it is preferable not to use the end portions in forming the light emitting element. Note that the resin film may be either a nonphotosensitive resin film or a photosensitive resin film. If using the photosensitive resin film, either positive or negative type films can be used.

(10) A display device according to the present invention includes:
- a transistor formed on a substrate surface; and
- a light emitting element connected with the transistor,
- the transistor including:
- an active layer formed of a semiconductor;
- a gate insulating film formed in contact with the active layer;
- a gate electrode facing the active layer through the gate insulating film;
- a barrier layer formed above the active layer;
- a planarization layer formed on the barrier layer; and
- a drain electrode formed on the planarization layer, the drain electrode constituting a laminate electrode having a laminate structure of a first metallic film and a second metallic film and including a portion where a part of the second metallic film is removed to expose the first metallic film,
- the light emitting element including:
- the portion where the first metallic film is exposed;
- a light emitting member formed in contact with the portion where the first metallic film is exposed; and
- an opposing electrode facing the portion where the first metallic film is exposed through the light emitting member, and the drain electrode being connected with the active layer through a first opening formed in the gate insulating film and the barrier layer and a second opening formed in the planarization layer.

(11) A display device according to the present invention includes:
a transistor formed on a substrate surface; and
a light emitting element connected with the transistor,
the transistor including:
an active layer formed of a semiconductor;
a gate insulating film formed in contact with the active layer;
a gate electrode facing the active layer through the gate insulating film;
a planarization layer formed above the active layer;
a barrier layer formed on the planarization layer; and
a drain electrode formed on the barrier layer,
the drain electrode constituting a laminate electrode having a laminate structure of a first metallic film and a second metallic film and including a portion where a part of the second metallic film is removed to expose the first metallic film,
the light emitting element including:
the portion where the first metallic film is exposed;
a light emitting member formed in contact with the portion where the first metallic film is exposed; and
an opposing electrode facing the portion where the first metallic film is exposed through the light emitting member, and
the barrier layer covering an upper surface of the planarization layer and a side surface of an opening formed in the insulating layer.

(12) A display device according to the present invention includes:
a transistor formed on a substrate surface; and
a light emitting element connected with the transistor,
the transistor including:
an active layer formed of a semiconductor;
a gate insulating film formed in contact with the active layer;
a gate electrode facing the active layer through the gate insulating film;
a planarization layer formed above the active layer;
a barrier layer formed on the planarization layer; and
a drain electrode formed on the barrier layer,
the drain electrode constituting a laminate electrode having a laminate structure of a first metallic film and a second metallic film and including a portion where a part of the second metallic film is removed to expose the first metallic film,
the light emitting element including:
the portion where the first metallic film is exposed;
a light emitting member formed in contact with the portion where the first metallic film is exposed; and
an opposing electrode facing the portion where the first metallic film is exposed through the light emitting member,
a source electrode and the drain electrode being connected with the active layer through an opening formed in the gate insulating film, the insulating layer, and the barrier layer, and
the barrier layer covering an upper surface of the planarization layer.

Note that, according to the structures stated in (10) to (12), an angle between a section of the second metallic film in the portion where a part of the second metallic film is removed to expose the first metallic portion and an upper surface of the second metallic film is preferably an obtuse angle. In other words, the above means that the portion concerned is formed by removing the second metallic film through etching and etching is preferably performed such that the etched section takes a tapered shape. This is because even when the light generated inside the light emitting member propagates laterally in the light emitting member, the light can be reflected by the section and taken out efficiently, provided that the section of the second metallic film has the tapered shape. According to the structures stated in (10) to (12), the emitted light in the lateral direction is reflected by the slope of the second metallic film formed in the step portion of the laminate electrode or condensed there, thereby increasing an amount of the emitted light that is to be taken out in a certain direction (direction in which the light passes through the opposing electrode). Also, for that purpose, it is preferable that the film thickness of the light emitting member be smaller than that of the second metallic film.

Further, the pixel portion is covered with the resin film except the portion where a part of the second metallic film is removed to expose the first metallic film. This is because the second metallic film is etched by using the resin film, so that the portions other than a part of the second metallic film (removed portion) are all covered with the resin film. However, the resin film is only needed to cover the pixel portion and it is not always required for the resin film to remain in the portions other than the pixel portion (e.g., driver circuit portion). Further, needless to say, a terminal portion for transmitting/receiving signals to/from an external circuit should be uncovered with the resins film.

Note that the first metallic film is preferably made of a metallic film capable of functioning as an anode of the light emitting element, such as a titanium film or a titanium nitride film. The second metallic film is preferably made of a metallic film such as an aluminum film (including an aluminum alloy film or an aluminum film added with other elements, the same being applied to the following description), which shows high reflectivity. In this example, only a two-layer structure composed of the first metallic film and the second metallic film is shown, but the multi-layer structure including the two or more layers can be adopted.

In the above structures of the present invention, the silicon nitride film used for the barrier layer is preferably made as fine as possible. The higher the fineness, the higher the barrier property. The diffusion blocking effect against the degassing component is thus enhanced. For example, when the organic resin film is used as the planarization layer, the diffusion of the component gas or moisture therefrom to the transistor side or the light emitting element side can be effectively suppressed.

Further, when the inorganic insulating film (typically, a spin on glass film) formed by spin-coating is used as the planarization layer as well, the above is rather extremely effective in controlling the diffusion of the component gas or moisture. Further, the SOG (spin on glass) film includes an organic SOG film and an inorganic SOG film. When considering the application to the present invention, the inorganic SOG film is preferable because of less degassing. Preferable examples of the inorganic SOG film include an SiOx film, a PSG (phosphorous silicate glass) film, a BSG (boron silicate glass) film, and a BPSG (boron phosphorous silicate glass) film, which are formed by spin-coating. Specifically, the SOG film is represented by OCD series manufactured by Tokyo Ohka Kogyo Co., Ltd.) and it is needless to say that the other known SOG films can be used.

BRIEF DESCRIPTION OF THE DRAWINGS

In the accompanying drawings:

FIGS. 1A to 1D are a top view, a circuit diagram, and sectional views for showing a device structure of a display device;

FIGS. 3A and 3B are sectional views for showing a device structure of a display device;

FIGS. 7A to 7C are sectional views for showing a device structure of a display device;

FIGS. 9A to 9D are a top view, a circuit diagram, and sectional views for showing a device structure of a display device;

FIGS. 10A and 10B are sectional views for showing a device structure of a display device;

FIGS. 11A and 11B are sectional views for showing a device structure of a display device;

FIGS. 12A and 12B are sectional views for showing a device structure of a display device;

FIGS. 14A to 14D are a top view, a circuit diagram, and sectional views for showing a device structure of a display device;

FIGS. 16A and 16B are sectional views for showing a device structure of a display device;

FIGS. 17A and 17B are sectional views for showing a device structure of a display device;

FIGS. 19A and 19B are a top view and a circuit diagram, respectively, for showing a device structure of a display device;

FIGS. 20A to 20C are sectional views for showing a device structure of a display device;

FIGS. 21A and 21B are sectional views for showing a device structure of a display device;

FIGS. 22A and 22B are sectional views for showing a device structure of a display device;

FIGS. 25A and 25B are sectional views for showing a device structure of a display device;

FIGS. 28A to 28D are a top view and sectional views for showing an outer appearance of a display device.

DETAILED DESCRIPTION OF THE PREFERRED EMBODIMENTS

Embodiment 1

Figure 2A:
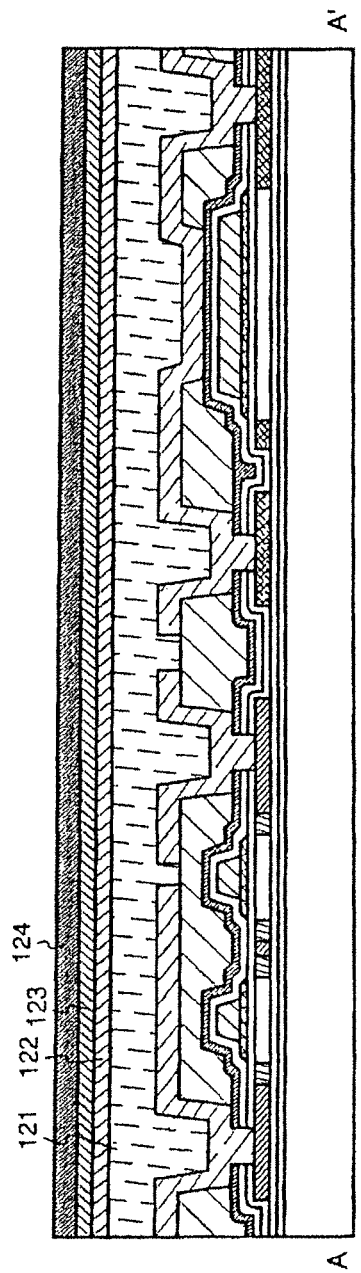
FIGS. 2A and 2B are sectional views for showing a device structure of a display device.

In this embodiment, an example of an electroluminescence display device of the present invention will be described. FIG. 1A is a top view of a pixel of the electroluminescence display device (note that a state up to the formation of a pixel electrode is indicated), FIG. 1B is a circuit diagram thereof, and FIGS. 1C and 1D each are a cross sectional view along a line A-A' or B-B'.

As shown in FIGS. 1A and 1B, a pixel portion of the electroluminescence display device includes a plurality of pixels which are surrounded by gate wirings 151, data wirings 152, and power source wirings (wirings for supplying a constant voltage or a constant current) 153 and arranged in matrix. In each of the pixels, a TFT 154 serving as a switching element (hereinafter referred to as a switching TFT), TFT 155 serving as means for supplying a current or a voltage for producing light emission of an light emitting element (hereinafter referred to as a driver TFT), a capacitor portion 156, and an light emitting element 157 are provided. Although not shown here, the light emitting element 157 can be formed by providing a light emitting layer over a pixel electrode 158.

Note that, in this embodiment, an n-channel TFT having a multi-gate structure is used as the switching TFT 154 and a p-channel TFT is used as the driver TFT 155. However, the pixel structure of the light emitting device is limited to this. Thus, the present invention can be applied to any known structure.

In the cross sectional view of FIG. 1C, the n-channel TFT 154 and the capacitor portion 156 are shown. Reference numeral 101 denotes a substrate, and a glass substrate, a ceramic substrate, a quartz substrate, a silicon substrate, or a plastic substrate (including a plastic film) can be used. In addition, reference numeral 102 denotes a silicon oxynitride film, 103 denotes a silicon oxynitride film, all which are laminated to serve as base films. Of course, the present invention is limited to these materials. Further, an active layer of the n-channel TFT 154 is provided on the silicon oxynitride film 103. The active layer has a source region 104, a drain region 105, LDD regions 106a to 106d, and channel formation regions 107a and 107b. In other words, it has two channel formation regions and four LDD regions between the source region 104 and the drain region 105.

Also, the active layer of the n-channel TFT 154 is covered with a gate insulating film 108, and a gate electrode (gate electrode layers 109a and 109b) and another gate electrode (gate electrode layers 110a and 110b) are provided thereon. In this embodiment, a silicon oxynitride film is used as the gate insulating film 108. When the above nitride insulating film such as an aluminum nitride film having a high relative dielectric constant is used, an occupying area of an element can be reduced. Thus, it is effective for the improvement of the scale of integration.

Also, a tantalum nitride film is used for the gate electrode layers 109a and 110a and a tungsten film is used for the gate electrode layers 109b and 110b. With respect to these metallic films, a selection ratio is high. Thus, such a structure can be obtained by selecting an etching condition. The etching condition is preferably referred to US 2001/0030322 according to the present applicant.

Also, a silicon nitride film or a silicon oxynitride film is provided as an insulating layer 111 covering the gate electrodes, and a silicon nitride film is provided thereon as a barrier layer 112. This silicon nitride film is formed by an RF sputtering method with nitride and argon as sputtering gases, and with silicon as a target, so that an extremely precise film can be formed and thereby can be useful as a barrier layer. Further, a planarized inorganic insulating film is provided on the barrier layer 112 as a planarization layer 113. In this embodiment, SOG (spin on glass) films or inorganic insulating films with a polished surface are used as the planarized insulating film.

In this case, a first opening is provided on the source and drain regions 104, 105 in a laminate composed of the gate insulating film 108, insulating layer 111 and barrier layer 112, and a second opening is provided on the planarization layer 113 to fit on the first opening therein. Such a structure can be obtained by a method selected from a method comprising: forming the first opening at the beginning; filling the first opening with the planarization layer once; forming the second opening finally, and a method comprising: providing the planarization layer first; forming the second opening; using a new mask to form the first opening in the second opening thereafter. However, since a dry etching method is preferably used for forming the first opening, it is desired to avoid the planarization layer 113 to be exposed to plasma as far as possible. From this point, it can be said that the former method is preferable.

Alternatively, the gate wiring 151 and a connection wiring (corresponding to a drain electrode) is connected with the source region 104 or the drain region 105 through the first and second openings. The connection wiring 114 is a wiring connected to a gate electrode of the driver TFT 155. A structure in which a wiring containing mainly low resistance metal such as aluminum or copper is sandwiched by other metallic films or an alloy film of these metals is preferably used for the data wiring 152 and the connection wiring 114.

Also, reference numeral 115 denotes a source region of the driver TFT 155, with which the power source wiring 153 is connected. In addition, the power source wiring 153 is opposite to a gate wiring 116 of the driver TFT 155 through the insulating layer 111 and the barrier layer 112, so that a storage capacitor 156a is formed. Further, the gate wiring 116 is opposite to a semiconductor film 117 through the gate insulating film 108 so that a storage capacitor 156b is formed. Because the power source wiring 153 is connected with a semiconductor layer 118, a charge is supplied therefrom, so that the semiconductor film 117 serves as an electrode. Thus, the capacitor portion 156 becomes a structure in which the storage capacitors 156a and 156b are connected in parallel, thereby obtaining a large capacity with a very small area. Furthermore, with respect to particularly the storage capacitor 156a, a silicon nitride film having a high relative dielectric constant is used for dielectric, so that a large capacity can be ensured. Because the dielectric of the storage capacity 156a is composed of a laminate structure of the insulating layer 111 and the barrier layer 112, a probability of occurrence of a pinhole is extremely low. Thus, a capacitor with high reliability can be formed.

When the first and second openings are formed, the number of masks used in a photolithography process is increased in comparison with conventional cases. However, when the increase in the number of masks is advantageously used, a new storage capacitor can be formed as described in this embodiment. Such a point is also one of important characteristics of the present invention. The characteristic of the present invention more than compensates for a demerit resulting from the increase in the number of masks, so that it greatly contributes to industrial progress. For example, when a high definition image display is obtained, it is required that a relative occupying area of the storage capacitor to an area of each pixel is reduced in a display portion to improve an aperture ratio. Therefore, it is extremely useful to increase a storage capacity.

Also, in FIG. 1D, reference numeral 119 denotes a drain region of the driver TFT 155, which is connected with a drain electrode 120. The electrode 120 is connected with a pixel electrode 158 to compose a pixel. In this embodiment, an oxide conductive film which is transparent with respect to visible light (typically, an ITO film) is used as the pixel electrode 158. However, the present invention is not limited to such a film. In addition, the pixel electrode 158 is formed after the formation of the drain electrode 120, so that the pixel electrode 158 is in contact with the top surface of the drain electrode 120, thereby becomes a structure of being connected with the drain electrode.

An example after the light emitting element 157 is actually formed in the electroluminescence display device having the above pixel structure is shown in FIG. 2. FIG. 2A is a cross sectional view corresponding to the cross section shown in FIG. 2C and shows a state in which the light emitting element 157 is formed on the pixel electrode 158. Note that, when the structure shown in FIG. 2A is used, the pixel electrode 158 functions as the anode of the light emitting element 157.

Figure 2B:
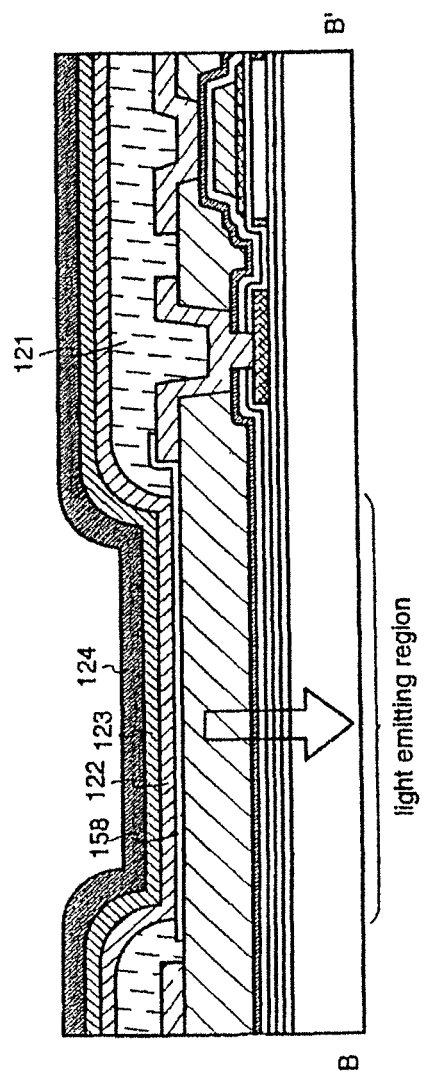

The end portion of the pixel electrode 158, as shown in FIG. 2B, is covered with a photosensitive organic resin film 121. The photosensitive organic resin film 121 is provided in a grid shape so as to frame each pixel or provided in a stripe shape in row unit or column unit. In any case, when it is formed on the first and second openings, a concave portion can be efficiently embedded and the entire surface can be also leveled. Note that, the photosensitive organic resin film can be of positive type or negative type. Further, a known resist material (polymeric material containing chromophore) can be also used.

Also, although not shown in the figure, if the surface of the photosensitive organic resin film 121 is covered with a silicon nitride film, so that degassing from the photosensitive organic resin film 121 can be suppressed. In addition, on the pixel electrode 158, an opening is provided on the photosensitive organic resin film 121, in the opening portion, a light emitting member 122 is in contact with the pixel electrode 958. The light emitting member 122 is generally composed by laminating thin films such as a light emitting layer, a carrier injecting layer, or a carrier transporting layer. However, any structure and material as far as light emission has been observed can be used. For example, SAlq (in which one of three ligands of $Alq_3$ is substituted for a triphenylsilanol structure) as an organic system material containing silicon can be also used as a charge transporting layer or a hole blocking layer.

Of course, the light emitting layer is not necessarily composed of only organic thin film, and a structure in which an organic thin film and an inorganic thin film are laminated may be also used. A polymeric thin film or a monomeric thin film may be used. In addition, a forming method is changed according to whether a polymer thin film or a low molecular thin film is used. However, the thin film is preferably formed by a known method.

Also, on the light emitting member 122, an opposing electrode 123 (here is a cathode) opposing to the pixel electrode 158 is formed via the light emitting member 122, and a silicon nitride film as a passivation film 124 is finally provided thereon. The material for the passivation film 124 can be the same as the barrier layer 112. A metallic thin film containing an element belonging to group 1 or 2 of the periodic table is preferably used as the cathode 124. A metallic film in which lithium of 0.2 wt % to 1.5 wt % (preferably, 0.5 wt % to 1.0 wt %) is added to aluminum is suitable in view of a charge injecting property and the like. Note that, if lithium is diffused, it is concerned that the operation of a TFT is influenced thereby. However, according to this embodiment, the TFT is completely protected by the barrier layer 112, so that it is unnecessary to concern the diffusion of lithium.

When the structures shown in FIGS. 2A and 2B are used, light emitted from the light emitting element is emitted from the substrate 101 passing through the pixel electrode 158. In this case, since the planarization layer 113 is of transparent type, the light emitted from the light emitting can pass through without problems.

With the electroluminescence display device having such a device structure, an influence of plasma damage is reduced, making it possible to suppress variations in threshold voltage of the transistors and to achieve uniform display characteristics.

Embodiment 2

In this embodiment, description will be given of an example of a device structure including the one in which a planarization layer and a barrier layer are reversed in position in Embodiment 1. Other structures thereof are the same as those in Embodiment 1 and thus, may be attained referring to the description of Embodiment 1. Accordingly, this embodiment will be described focusing on the point different from Embodiment 1.

FIGS. 3A and 3B are views corresponding to FIGS. 2A and 2B in Embodiment 1, respectively. In the figures, some components are denoted by the same reference symbols as those in Embodiment 1. In this embodiment, a planarization layer 301 is formed on an insulating layer 111 and a second opening is formed on the planarization layer 301, after which a barrier layer 302 is formed so as to cover a top surface of the planarization layer 301 and a side surface (inner wall surface) of the second opening. Further, inside the second opening, a gate insulating film 108, the insulating layer 111, and a barrier layer 112 are etched to form a first opening.

With the structure of this embodiment, the planarization layer 301 can be completely covered with the insulating layer 111 and the barrier layer 302 and degassing from the planarization layer 301 can be completely prevented through sealing. That is, a degassing component diffuses neither to a light emitting element side nor to a transistor side, so that a highly reliable display device controlled in deterioration with time can be obtained. Needless to say, similar to Embodiment 11, an influence of plasma damage is reduced, making it possible to suppress variations in threshold voltage of the transistors and to achieve uniform display characteristics.

Embodiment 3

In this embodiment, description will be given of an example of a device structure including the one in which a planarization layer and a barrier layer are reversed in position in Embodiment 1. Other structures thereof are the same as those in Embodiment 1 and thus, may be attained referring to the description of Embodiment 1. Accordingly, this embodiment will be described focusing on the point different from Embodiment 1.

Figures 4A, 4B:
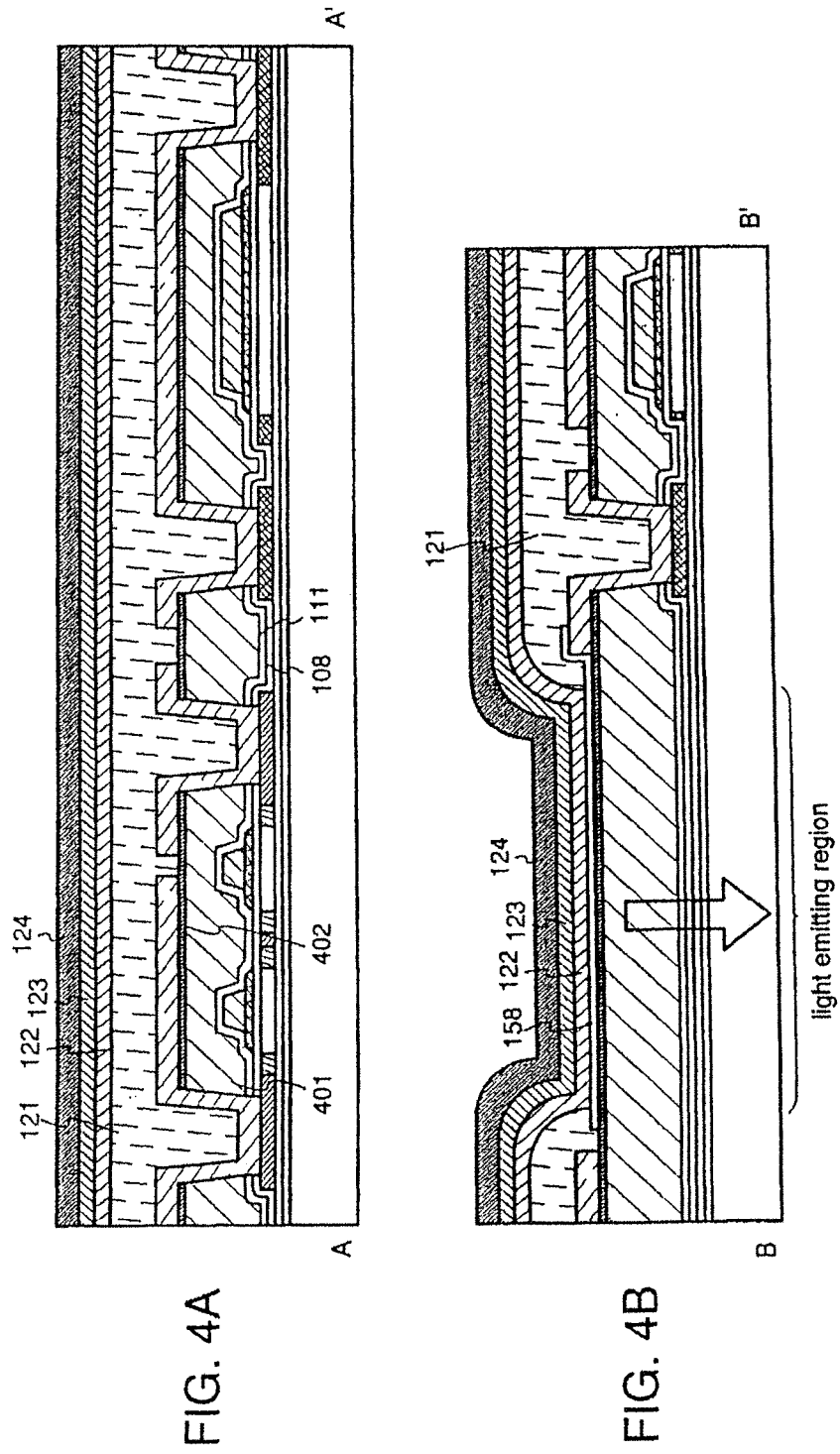
FIGS. 4A and 4B are sectional views for showing a device structure of a display device.

FIGS. 4A and 4B are views corresponding to FIGS. 2A and 2B in Embodiment 1, respectively. In the figures, some components are denoted by the same reference symbols as those in Embodiment 1. In this embodiment, a planarization layer 401 is formed on an insulating layer 111 and a barrier layer 402 is formed thereon, after which the barrier layer 302, planarization layer 401, insulating layer 111, and a gate insulating film 108 are etched to form an opening.

With the structure of this embodiment, degassing from the planarization layer 401 can be suppressed. That is, suppressing degassing components diffuses to the light emitting element side and to the transistor side, so that a highly reliable display device controlled in deterioration with time can be obtained. Needless to say, similar to Embodiment 1, an influence of plasma damage is reduced, making it possible to suppress variations in threshold voltage of the transistors and to achieve uniform display characteristics.

Embodiment 4

Figure 5A:
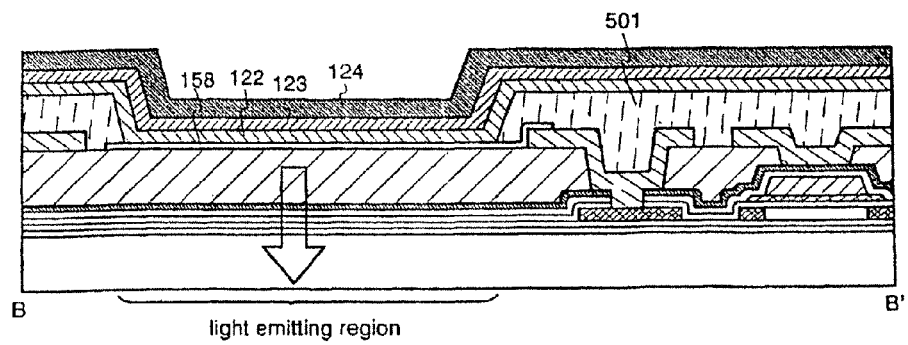
FIGS. 5A to 5C are sectional views for showing a device structure of a display device.
Figure 5B:
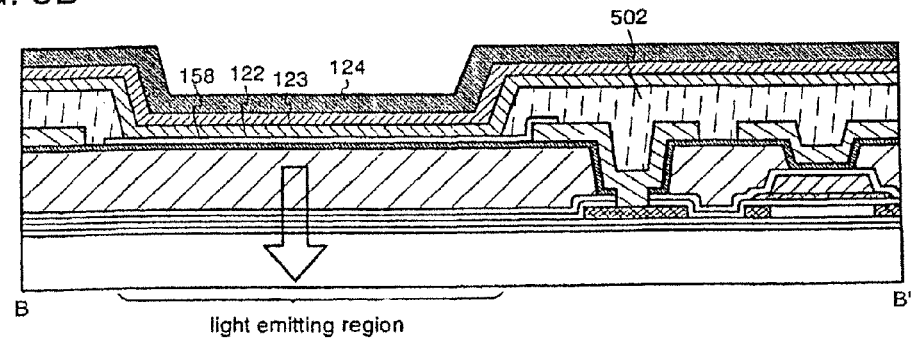
Figure 5C:
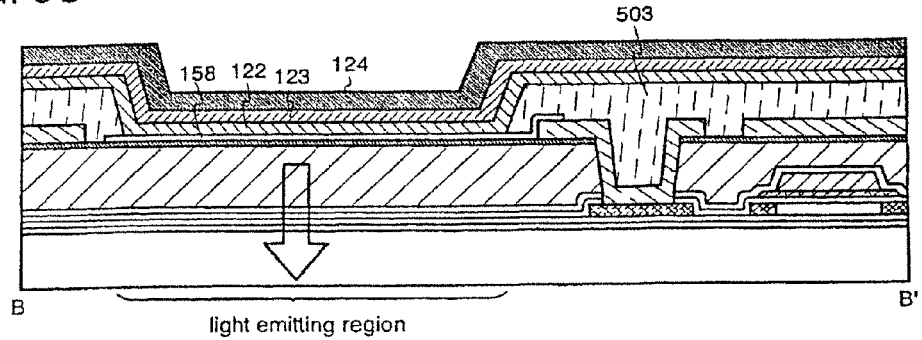

This embodiment shown in FIGS. 5A to 5C adopts the device structures each corresponding to Embodiment 1 to 3, except that nonphotosensitive organic resin films 501 to 503 are used as a resin film covering end portions of a pixel electrode 158 by way of example. Other structures thereof are the same as those in Embodiments 1 to 3 and thus, may be attained referring to descriptions of Embodiments 1 to 3. Accordingly, this embodiment will be described focusing on the point different from Embodiments 1 to 3.

When using a photosensitive organic resin film, as shown in FIGS. 2B, 3B, and 4B, an upper end portion is curved (with a curvature) and the structure is useful in increasing a coverage, at the time of forming a light emitting member and an opposing electrode. The present invention, however, may not be limited to this. As described in this embodiment, the non-photosensitive organic resin film can be used without any problem. Moreover, when the upper end portion of the resin film covering the end portions of the pixel electrode 158 is curved (with the curvature), if washing the surface of the pixel electrode 158, any foreign material (such as dust) can be prevented from remaining in the foot portions thereof.

Note that this embodiment is achieved by partially modifying the structures of Embodiments 1 to 3, which not impairs the effects of Embodiments 1 to 3, but can achieve the similar effects.

Embodiment 5

Figures 6A, 6B, 6C:
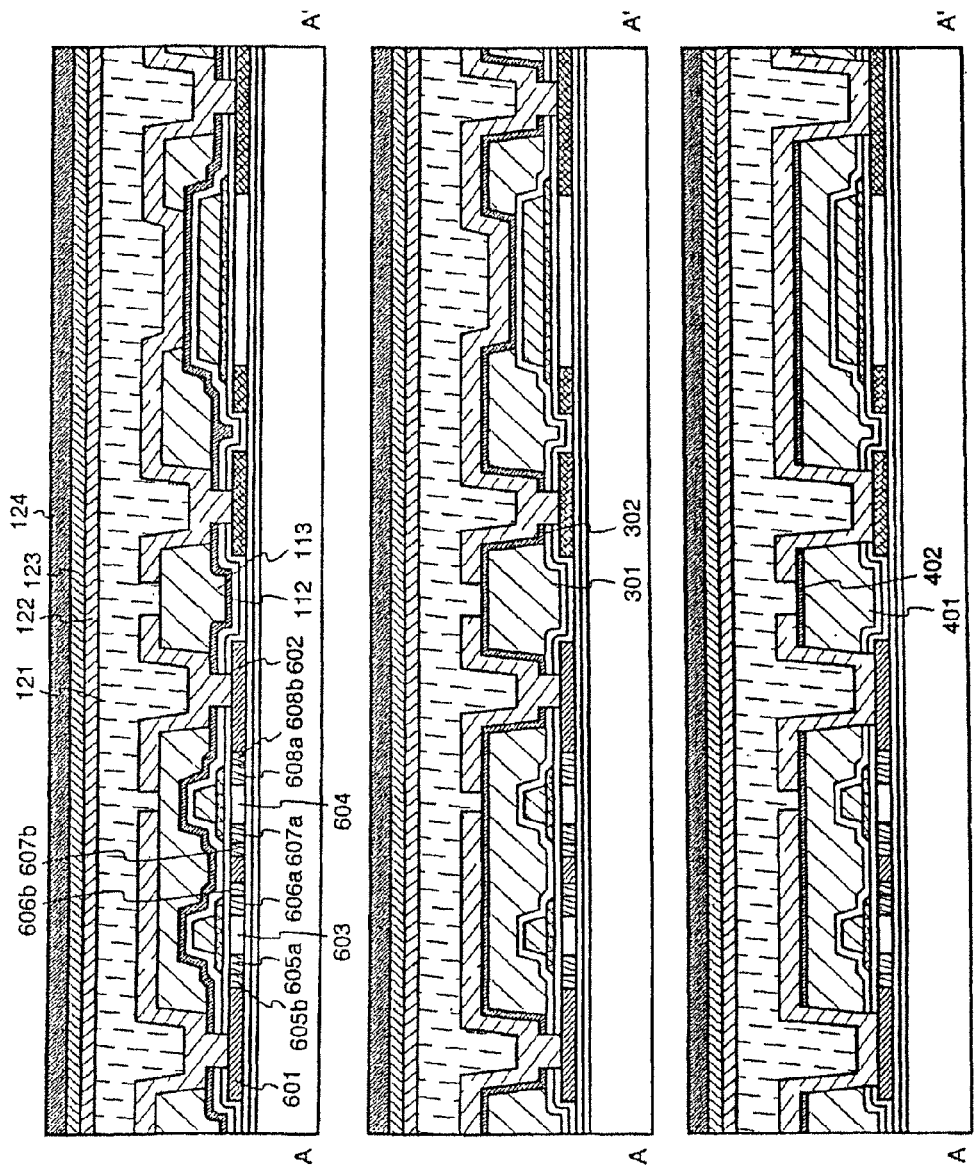
FIGS. 6A to 6C are sectional views for showing a device structure of a display device.

This embodiment shown in FIGS. 6A to 6C adopts the device structures each corresponding to Embodiments 1 to 3 except that the structure of the active layer of the thin film transistor is changed by way of example. Other structures thereof are the same as those of Embodiments 1 to 3 and thus, may be attained referring to the description of Embodiments 1 to 3. Accordingly, this embodiment will be described focusing on the point different from Embodiments 1 to 3.

In FIG. 6A, the active layer of the thin film transistor includes a source region 601 and a drain region 602, and has four LDD (lightly doped drain) regions and two channel formation regions 603, 604 therebetween. The four LDD regions are each obtained by combining two LDD regions: LDD regions 605*a*, 605*b*; LDD regions 606*a*, 606*b*; LDD regions 607*a*, 607*b*; and LDD regions 608*a*, 608*b*. Those two regions are combined to function as the LDD region.

For example, the LDD region 605*a* is formed so as to overlap the gate electrode, whereas the LDD region 605*b* is formed so as not to overlap the gate electrode. In this case, the LDD region 605*a* contributes to suppression of hot carrier degradation, whereas the LDD region 605*b* contributes to reduction of an OFF current (also called a leak current). Those characteristics are well known in the art and reference will be made of US 2001/0055841 disclosed by the applicants of the present invention.

Note that, this embodiment is achieved by partially modifying the structures of Embodiments 1 to 3, which not impairs the effects of Embodiments 1 to 3, but can achieve the similar effects. Also, this embodiment can be combined with Embodiment 4.

Embodiment 6

This embodiment shown in FIGS. 7A to 7C adopts the device structures each corresponding to Embodiments 1 to 3 except that the structures of the active layer of the thin film transistor and the gate electrode thereof are changed by way of example. Other structures thereof are the same as those of Embodiments 1 to 3 and thus, may be attained referring to the description of Embodiments 1 to 3. Accordingly, this embodiment will be described focusing on the point different from Embodiments 1 to 3. Note that, the structures of the active layer and the gate electrode of FIGS. 7A to 7C are the same, so that description will be only made of the structures of FIG. 7A.

In FIG. 7A, the active layer of the thin film transistor has a source region 701 and a drain region 702, and has four LDD (lightly doped drain) regions 703a to 703d and two channel formation regions 704a, 704b therebetween. Also, the LDD regions 703a to 703d are characterized in that the regions are formed before forming gate electrodes 705 and 706. If formed in the stated order, the LDD regions and the gate electrodes can be designed as to the extent to which they are overlapped with each other, according to specifications of transistor characteristics. Therefore, the structures of the active layer can be made different for each circuit. Those characteristics are well known in the art and reference will be made of U.S. Pat. No. 6,306,694 disclosed by the applicants of the present invention.

Note that, this embodiment is achieved by partially modifying the structures of Embodiments 1 to 3, which not impairs the effects of Embodiments 1 to 3, but can achieve the similar effects. Also, this embodiment can be combined with Embodiments 4 and 5.

Embodiment 7

Figure 8A:
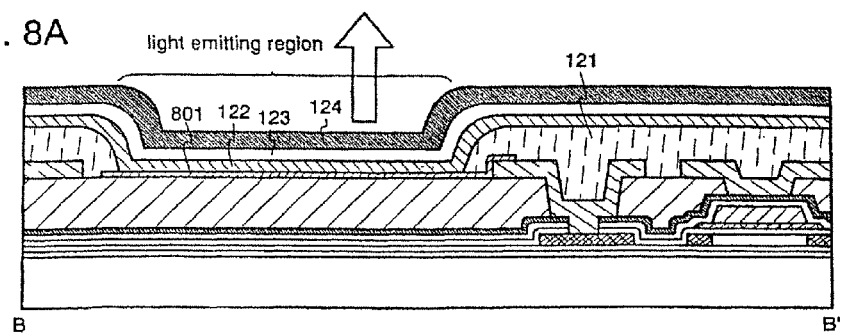
FIGS. 8A to 8C are sectional views for showing a device structure of a display device.
Figure 8B:
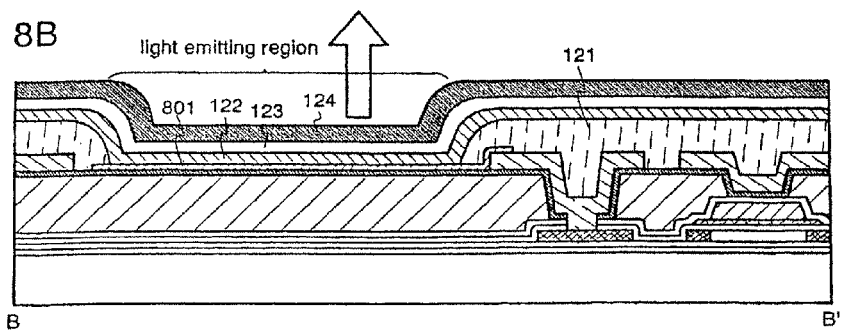
Figure 8C:
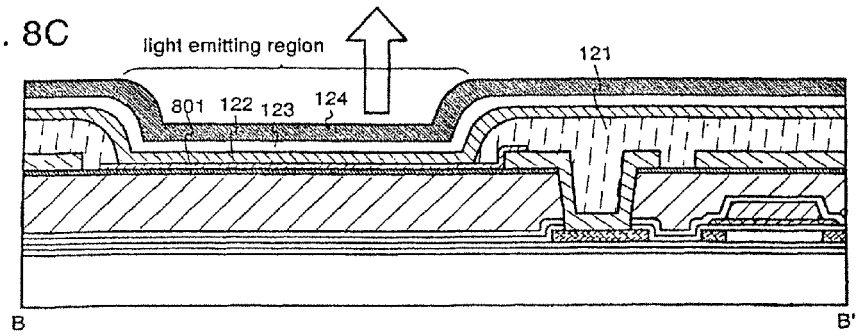

This embodiment shown in FIGS. 8A to 8C adopts the device structures each corresponding to Embodiments 1 to 3 except that the structure of the light emitting element is changed by way of example. Other structures thereof are the same as those of Embodiments 1 to 3 and thus, may be attained referring to the description of Embodiments 1 to 3. Accordingly, this embodiment will be described focusing on the point different from Embodiments 1 to 3. Note that the device structures (except the structure of the light emitting element) of FIGS. 8A to 8C are the same, so that description will be only made of the structure of FIG. 8A.

In FIG. 8A, a pixel electrode 801 is made of a metallic film serving as an anode, which is constituted of gold, platinum, titanium, titanium nitride, or tungsten. On the pixel electrode 801, as described in Embodiment 1, the light emitting member 122, the opposing electrode 123 serving as a cathode, and a passivation film 124 are formed.

Note that, in this embodiment, an example where the metallic film is used for an anode is shown, but a metallic film serving as a cathode can be formed instead of forming the anode 801. The metallic film serving as the cathode may be formed of aluminum (including aluminum added with an element belonging to Group 1 or 2 in the periodic table, typically, an alloy of aluminum and lithium) or an alloy of magnesium and silver. In this case, although it is needed to change the structure of the light emitting member 122 and to form a transparent electrode serving as an anode on the light emitting member 122, both can be attained by using the known structures.

Further, in this embodiment, considering the fact that pixel electrode serves as an anode, the driving TFT is set to a p-channel TFT in its polarity, but when the pixel electrode is made to serve as a cathode, it is preferable to set the driving to an n-channel TFT in its polarity.

Note that this embodiment is achieved by partially modifying the structures of Embodiments 1 to 3, which not impairs the effects of Embodiments 1 to 3, but can achieve the similar effects. Also, this embodiment can be combined with Embodiments 4 to 6.

Embodiment 8

This embodiment shown in FIGS. 9A to 9D adopts the device structure corresponding to Embodiment 1 except that the connection structures of the pixel electrode and the drain electrode are changed by way of example. Other structures thereof are the same as those of Embodiment 1 and thus, may be attained referring to the description of Embodiment 1. Accordingly, this embodiment will be described focusing on the point different from Embodiment 1.

A pixel electrode 901 shown in FIG. 9A is connected in contact with a lower surface of a drain electrode 902 as shown in FIG. 9D. That is, after forming the planarization layer 113, the pixel electrode 901 may be formed, followed by forming the drain electrode 902 so as to be partially overlapped with the pixel electrode 901. Here, the order in which the pixel electrode 901 and the drain electrode 902 are formed may follow the various methods, as represented by the following two methods.

Firstly, after forming the planarization layer 113, the pixel electrode 901 is formed, followed by forming first and second openings in the planarization layer 113 and then, forming the drain electrode 902. Secondly, after forming the first and second openings in the planarization layer 113, the pixel electrode 901 and the drain electrode 902 are formed in this order. The order may be appropriately set by the designer.

Next, FIGS. 10A and 10B are sectional views corresponding to FIGS. 9C and 9D, at a point where processing up to the formation of the light emitting element 157 is completed. The materials etc. for the photosensitive organic resin film 121, the light emitting member 122, the opposing electrode 123, and the passivation film 124 are as described in Embodiment 1.

Note that this embodiment is achieved by partially modifying the structures of Embodiment 1, which not impairs the effects of Embodiment 1, but can achieve the similar effects. Also, this embodiment can be combined with Embodiments 4 to 7.

Embodiment 9

This embodiment shown in FIGS. 11A and 11B adopts the device structure corresponding to Embodiment 2 except that the connection structures of the pixel electrode and the drain electrode are changed by way of example. Other structures thereof are the same as those of Embodiment 2 and thus, may be attained referring to the description of Embodiment 2. Also, the same description as in Embodiment 8 may be applied to the connection relationship between the pixel electrode and the drain electrode and the order of formation thereof. The above relationship and the order would be apparent from the description of Embodiment 8.

Note that, this embodiment is achieved by partially modifying the structures of Embodiment 2, which not impairs the effects of Embodiment 2, but can achieve the similar effects. Also, this embodiment can be combined with Embodiments 4 to 7.

Embodiment 10

This embodiment shown in FIGS. 12A and 12B adopts the device structure corresponding to Embodiment 3 except that the connection structures of the pixel electrode and the drain electrode are changed by way of example. Other structures thereof are the same as those of Embodiment 3 and thus, may be attained referring to the description of Embodiment 3. Also, the same description as in Embodiment 8 may be applied to the connection relationship between the pixel electrode and the drain electrode and the order of formation thereof. The above relationship and the order would be apparent from the description of Embodiment 8.

Note that this embodiment is achieved by partially modifying the structures of Embodiment 3, which not impairs the effects of Embodiment 3, but can achieve the similar effects. Also, this embodiment can be combined with Embodiments 4 to 7.

Embodiment 11

Figure 13A:
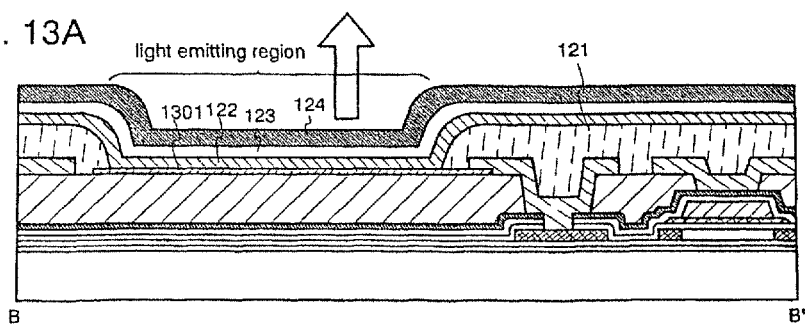
FIGS. 13A to 13C are sectional views for showing a device structure of a display device.
Figure 13B:
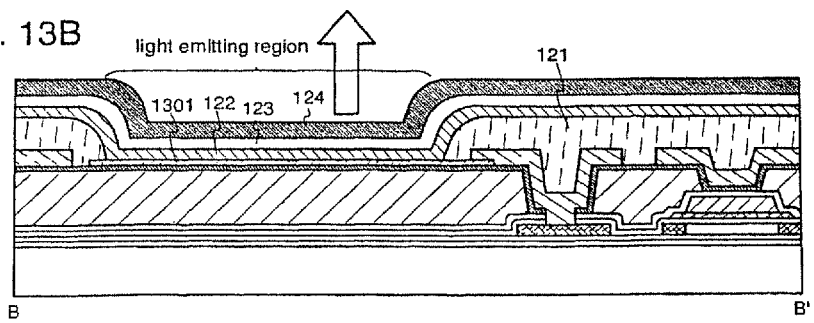
Figure 13C:
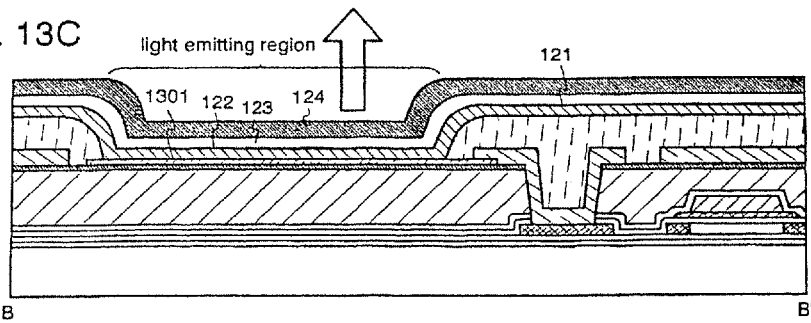

This embodiment shown in FIGS. 13A to 13C adopts the device structures each corresponding to Embodiments 8 to 10 except that the structure of the light emitting element is changed by way of example. Other structures thereof are the same as those of Embodiments 8 to 10 and thus, may be attained referring to the description of Embodiments 8 to 10. Accordingly, this embodiment will be described focusing on the point different from Embodiments 8 to 10. Note that, the device structures (except the structure of the light emitting element) of FIGS. 13A to 13C are the same, so that description will be only made of the structure of FIG. 13A.

In FIG. 13A, a pixel electrode 1301 is made of a metallic film serving as an anode, which is constituted of gold, platinum, titanium, titanium nitride, or tungsten. On the pixel electrode 1301, as described in Embodiment 1, the light emitting member 122, the opposing electrode 123 serving as a cathode, and the passivation film 124 are formed.

Note that, in this embodiment, an example where the metallic film is used for the anode is shown, but a metallic film serving as a cathode can be formed instead of forming the anode 1301. The metallic film serving as the cathode may be formed of aluminum (including aluminum added with an element belonging to Group 1 or 2 in the periodic table, typically, an alloy of aluminum and lithium) or an alloy of magnesium and silver. In this case, although it is needed to change the structure of the light emitting member 122 and to form a transparent electrode serving as the anode on the light emitting member 122, both can be attained by using the known structures.

Further, in this embodiment, considering the fact that pixel electrode serves as the anode, the driving TFT is set to a p-channel TFT in its polarity, but when the pixel electrode is made to serve as the cathode, it is preferable to set the driving TFT to an n-channel TFT in its polarity.

Note that, this embodiment is achieved by partially modifying the structures of Embodiments 8 to 10, which not impairs the effects of Embodiments 8 to 10, but can achieve the similar effects. Also, this embodiment can be combined with Embodiments 4 to 6 and 8 to 10.

Embodiment 12

This embodiment shown in FIGS. 14A to 14D adopts the device structure corresponding to Embodiment 1 except that the connection structures of the pixel electrode and the drain electrode are changed by way of example. Other structures thereof are the same as those of Embodiment 1 and thus, may be attained referring to the description of Embodiment 1. Accordingly, this embodiment will be described focusing on the point different from Embodiment 1.

As shown in FIG. 14A, a planarization layer 1401 is formed on the drain electrode 120 and a power supply wiring 153, and a pixel electrode 1402 is formed on the planarization layer 1401. Thai is, the pixel electrode 1402 is electrically connected with a drain region 119 through a drain electrode 120 rather than connected in direct contact with the drain region 119. At this time, an insulating layer 1403 may be made either of an inorganic insulating film or of an organic insulating film. Needless to say, the planarization layer made of the SOG film etc. is used as the insulating layer 1403, which is more effective in improving evenness.

Figure 15A:
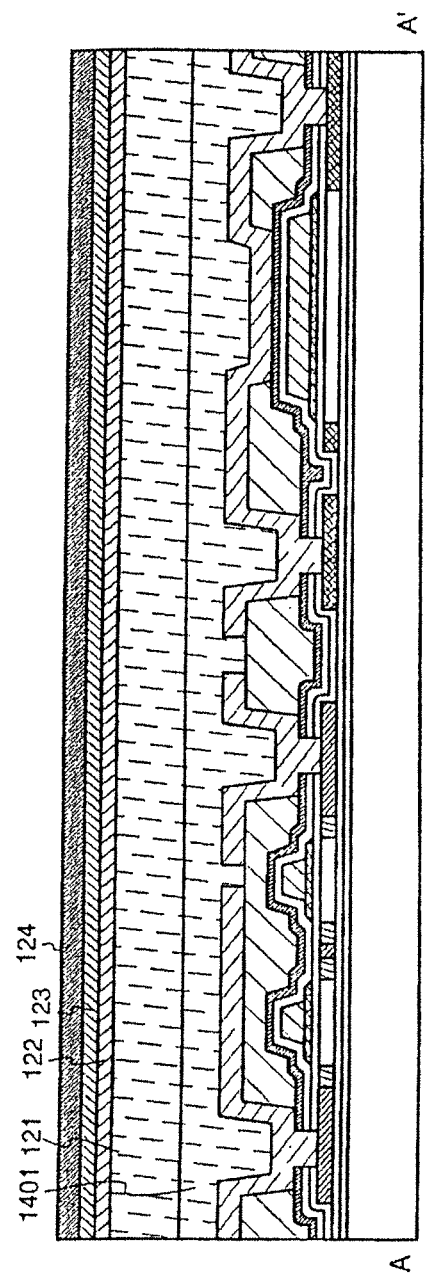
FIGS. 15A and 15B are sectional views for showing a device structure of a display device.
Figure 15B:
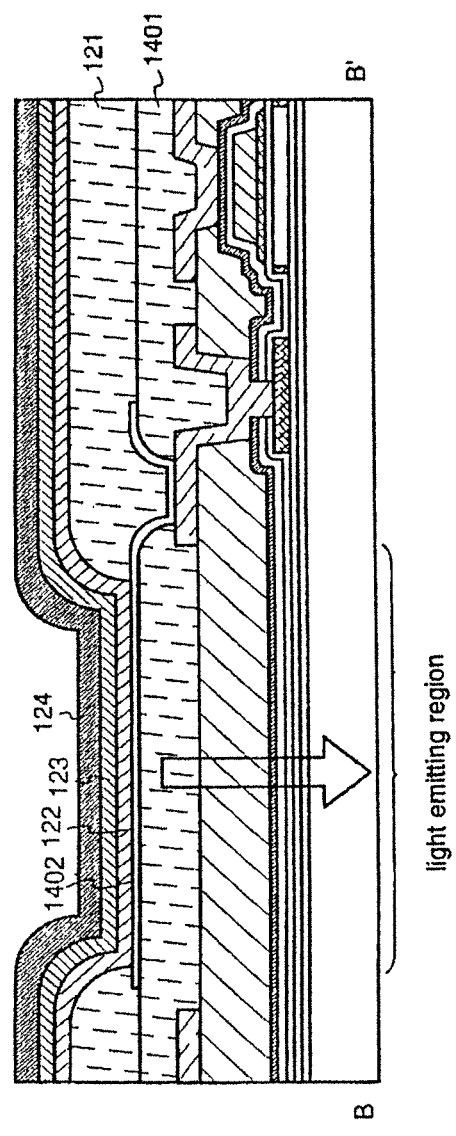

Next, FIGS. 15A and 15B are sectional views corresponding to FIGS. 14C and 14D, at a point where processing up to the formation of the light emitting element 157 is completed. The materials etc. for the photosensitive organic resin film 121, the light emitting member 122, the opposing electrode 123, and the passivation film 124 are as described in Embodiment 1.

Note that this embodiment is achieved by partially modifying the structures of Embodiment 1, which not impairs the effects of Embodiment 1, but can achieve the similar effects. Also, this embodiment can be combined with Embodiments 4 to 7.

Embodiment 13

This embodiment shown in FIGS. 16A and 16B adopts the device structure corresponding to Embodiment 2 except that the connection structures of the pixel electrode and the drain electrode are changed by way of example. Other structures thereof are the same as those of Embodiment 2 and thus, may be attained referring to the description of Embodiment 2. Also, the same description as in Embodiment 12 may be applied to the connection relationship between the pixel electrode and the drain electrode and the order of formation thereof. The above relationship and the order would be apparent from the description of Embodiment 12.

Note that, this embodiment is achieved by partially modifying the structures of Embodiment 2, which not impairs the effects of Embodiment 2, but can achieve the similar effects. Also, this embodiment can be combined with Embodiments 4 to 7.

Embodiment 14

This embodiment shown in FIGS. 17A and 17B adopts the device structure corresponding to Embodiment 3 except that the connection structures of the pixel electrode and the drain electrode are changed by way of example. Other structures thereof are the same as those of Embodiment 3 and thus, may be attained referring to the description of Embodiment 3. Also, the same description as in Embodiment 12 may be applied to the connection relationship between the pixel electrode and the drain electrode and the order of formation thereof. The above relationship and the order would be apparent from the description of Embodiment 12.

Note that this embodiment is achieved by partially modifying the structures of Embodiment 3, which not impairs the effects of Embodiment 3, but can achieve the similar effects. Also, this embodiment can be combined with Embodiments 4 to 7.

Embodiment 15

Figure 18A:
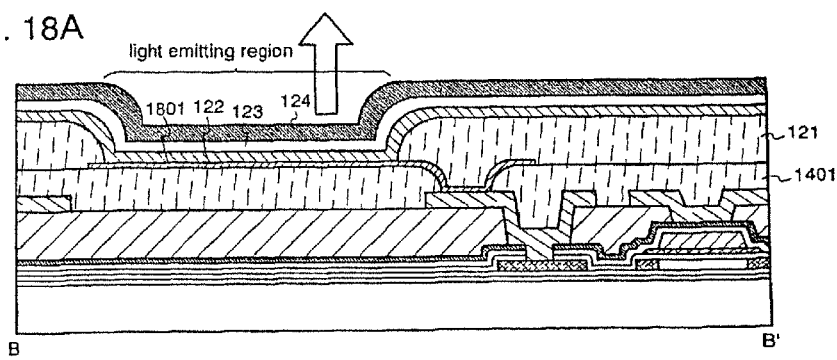
FIGS. 18A to 18C are sectional views for showing a device structure of a display device.
Figure 18B:
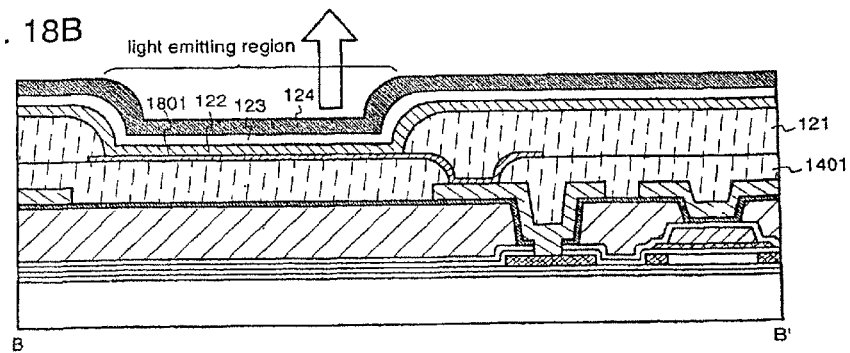
Figure 18C:
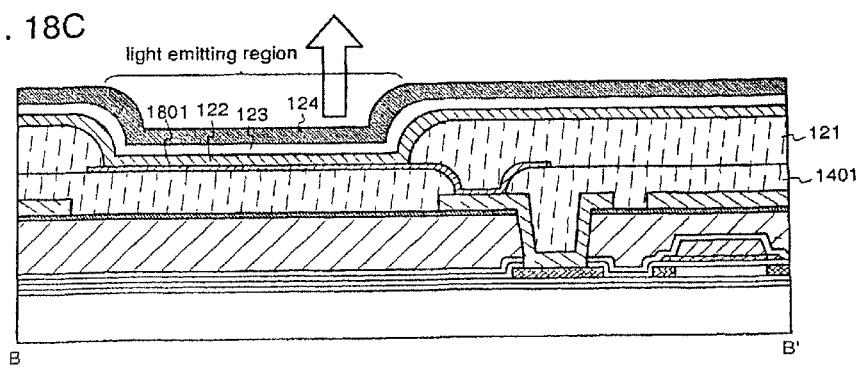

This embodiment shown in FIGS. 18A to 18C adopts the device structures each corresponding to Embodiments 12 to 14 except that the structure of the light emitting element is changed by way of example. Other structures thereof are the same as those of Embodiments 12 to 14 and thus, may be attained referring to the description of Embodiments 12 to 14. Accordingly, this embodiment will be described focusing on the point different from Embodiments 12 to 14. Note that the device structures (except the structure of the light emitting element) of FIGS. 18A to 18C are the same, so that description will be only made of the structure of FIG. 18A.

In FIG. 18A, a pixel electrode 1801 is made of a metallic film serving as an anode, which is constituted of gold, platinum, titanium, titanium nitride, or tungsten. On the pixel electrode 1801, as described in Embodiment 1, the light emitting member 122, the opposing electrode 123 serving as a cathode, and the passivation film 124 are formed.

Note that, in this embodiment, an example where the metallic film is used for the anode is shown, but a metallic film serving as a cathode can be formed instead of forming the anode 1801. The metallic film serving as the cathode may be formed of aluminum (including aluminum added with an element belonging to Group 1 or 2 in the periodic table, typically, an alloy of aluminum and lithium) or an alloy of magnesium and silver. In this case, although it is needed to change the structure of the light emitting member 122 and to form a transparent electrode serving as the anode on the light emitting member 122, both can be attained by using the known structures.

Further, in this embodiment, considering the fact that pixel electrode serves as the anode, the driving TFT is set to a p-channel in its polarity, but when the pixel electrode is made to serve as the cathode, it is preferable to set the driving TFT to an n-channel TFT in its polarity.

Note that this embodiment is achieved by partially modifying the structures of Embodiments 12 to 14, which not impairs the effects of Embodiments 12 to 14, but can achieve the similar effects. Also, this embodiment can be combined with Embodiments 4 to 6 and 12 to 14.

Embodiment 16

This embodiment shown in FIGS. 19A and 19B adopts the device structures each corresponding to Embodiment 1 except that the structure of the pixel electrode is changed by way of example. Other structures thereof are the same as those of Embodiment 1 and thus, may be attained referring to the description of Embodiment 1. Accordingly, this embodiment will be described focusing on the point different from Embodiment 1.

First, FIG. 19A is a CAD diagram for showing an example of an applicable pixel structure when using an electrode structure of this embodiment. FIG. 19B is a circuit diagram of the CAD diagram of FIG. 19A. Needless to say, this embodiment is not limited to the pixel structure shown in FIGS. 19A and 19B. In this embodiment, the metallic film is used for the pixel electrode, and light is taken out in a direction opposite to the substrate. Therefore, any circuit can be formed below the pixel electrode without reducing an opening ratio (ratio of an effective display region to a pixel area) and thus, the pixels can individually obtain a variety of functions. Note that the pixel structure shown in FIGS. 19A and 19B is disclosed by the applicants of the present invention in the specification of U.S. patent application Ser. No. 10/245,711 and is presented as a novel structure according to the invention by the applicants of the present invention.

Here, the device structure will be more specifically described with reference to FIGS. 20A to 20C. Note that the structure of the thin film transistor is the same as that in Embodiment 1 and thus, may be attained referring to the description of Embodiment 1. This embodiment differs from Embodiment 1 in terms of the structures of data wirings, drain electrode, and the like formed on the planarization layer 113.

As shown in FIGS. 20A and 20B, on the planarization layer 113, a titanium film 11, a titanium nitride film 12, and an aluminum film 13 are formed. The aluminum film 13 is partially removed through etching to expose the titanium nitride film 12. The aluminum film 13 is etched using a resin film 14 as a mask, and the resin film 14 also functions similarly to the photosensitive organic resin film 121 in Embodiment 1 as it is. Namely, the resin film 14 is formed to cover the above component exclusive of the portion where the titanium nitride film 12 is exposed. A light emitting member 15 is formed in contact with the portion where the titanium nitride film 12 is exposed and an opposing electrode 16 and a passivation film 17 are formed thereon.

FIG. 20C is an enlarged view of a region 10 surrounded by the dotted line of FIG. 20B. As shown in FIG. 20C, an etched section of the aluminum film 13 takes a tapered shape having the angle of 30 to 60° (preferably, 45°). That is to say, the angle between the section of the aluminum film and the upper surface thereof is the obtuse angle. With this structure, the light emitted from the light emitting member 15 is classified into three lights: the light directly taken out (direct light); the light taken out after being reflected by the titanium nitride film (reflection light); and the light taken out after propagating laterally in the light emitting member 15 and then, being reflected by the section of the aluminum film 13 (reflection light). As a result, as compared with the conventional structure, it can be expected to increase efficiency in taking out the light.

Figure 24A:
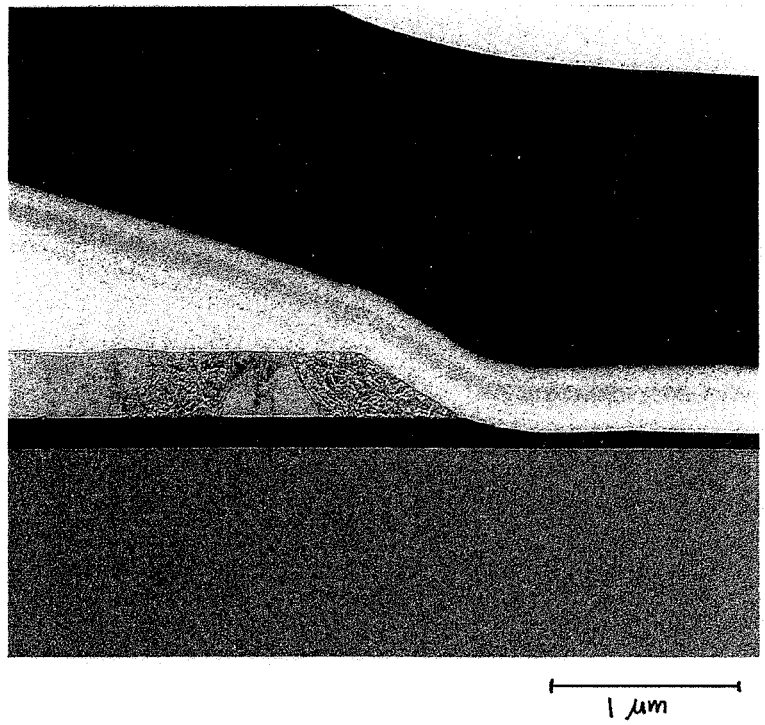
FIGS. 24A and 24B show a transmission electron microscope photograph of a structure of a pixel electrode.
Figure 24B:
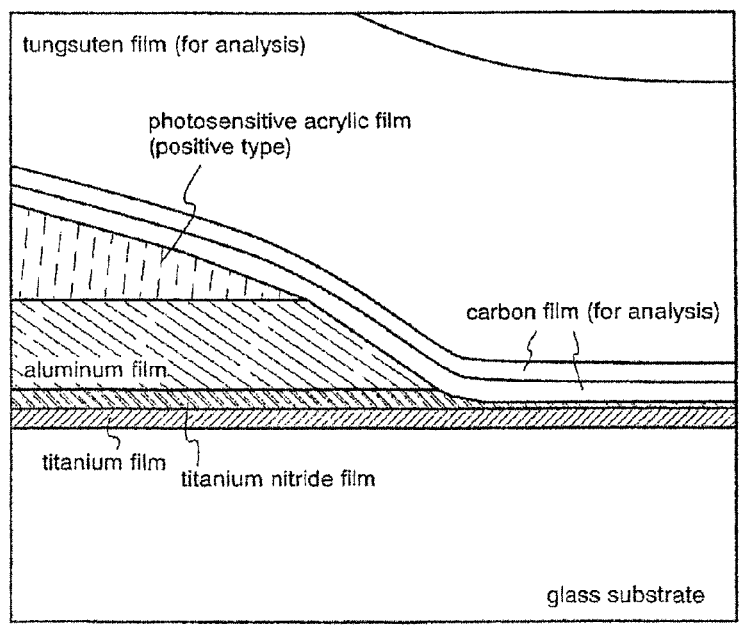

Note that a TEM (transmission electron microscope) photograph in section when the pixel electrode is actually formed according to the structure as described above (FIG. 24A) and a schematic diagram thereof (FIG. 24B) are shown. As will be confirmed from the figures, the aluminum film takes the tapered shape and the titanium nitride film is exposed.

Also, in this embodiment, the titanium film constitutes a lowest layer so as to enable an ohmic contact with a drain region made of a semiconductor. The titanium nitride film (if its surface is subjected to UV irradiation, a work function increases and thus, this process is effective) capable of serving as an anode is formed thereon. Further, an aluminum film is formed on the top as a reflective electrode for preventing light leak and thus, a three-layer structure is adopted. However, the present invention is not limited to the above structure, and the provision of a first metallic film serving as an anode (corresponding to the titanium nitride film in this embodiment) and a second metallic film serving as the reflective electrode (corresponding to the aluminum film in this embodiment) suffices therefor.

Note that this embodiment is achieved by partially modifying the structures of Embodiment 1, which not impairs the effects of Embodiment 1, but can achieve the similar effects. Further, without using an oxide conductive film such as ITO, the metallic film formed as the data wirings etc., is applied to the anode as it is, thereby reducing the number of steps. Also, this embodiment can be combined with Embodiments 4 to 6 or Embodiment 15 (as a substitute for the pixel electrode 1801), Embodiment 17

This embodiment shown in FIGS. 21A and 21B adopts the device structure corresponding to Embodiment 2 except that the structure of the pixel electrode is changed by way of example. Other structures thereof are the same as those of Embodiment 2 and thus, may be attained referring to the description of Embodiment 2. Also, the same description as in Embodiment 16 may be applied to the structure of the pixel electrode. The above structure would be apparent from the description of Embodiment 16, Note that this embodiment is achieved by partially modifying the structures of Embodiment 2, which not impairs the effects of Embodiment 2, but can achieve the similar effects. Also, this embodiment can be combined with Embodiments 4 to 7 and 15.

Embodiment 18

This embodiment shown in FIGS. 22A and 22B adopts the device structure corresponding to Embodiment 3 except that the structure of the pixel electrode is changed by way of example. Other structures thereof are the same as those of Embodiment 3 and thus, may be attained referring to the description of Embodiment 3. Also, the same description as in Embodiment 16 may be applied to the structure of the pixel electrode. The above structure would be apparent from the description of Embodiment 16.

Note that this embodiment is achieved by partially modifying the structures of Embodiment 3, which not impairs the effects of Embodiment 3, but can achieve the similar effects. Also, this embodiment can be combined with Embodiments 4 to 7 and 15.

Embodiment 19

Figure 23A:
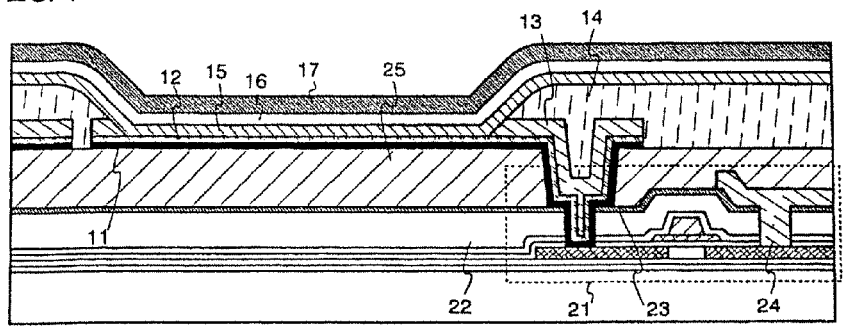
FIGS. 23A to 23C are sectional views for showing a device structure of a display device.

In this embodiment, the structure shown in FIG. 23A is a modified structure of Embodiment 16, in which the barrier layer 23 is formed so as to cover the insulating layer 22 of the driving TFT 21 and the power supply wiring 24 is formed thereon. Further, the planarization layer 25 is formed so as to cover the power supply wiring 24. The film thickness of the insulating layer 22 may be selected in a range from 0.3 to 1 μm. Through the second opening formed in the planarization layer 25 and the first opening formed in each insulating layer under the barrier layer 23, the pixel electrode is electrically connected with the driving TFT 21. The structures of the pixel electrode and the light emitting element may be apparent from the description of Embodiment 16.

Figure 23B:
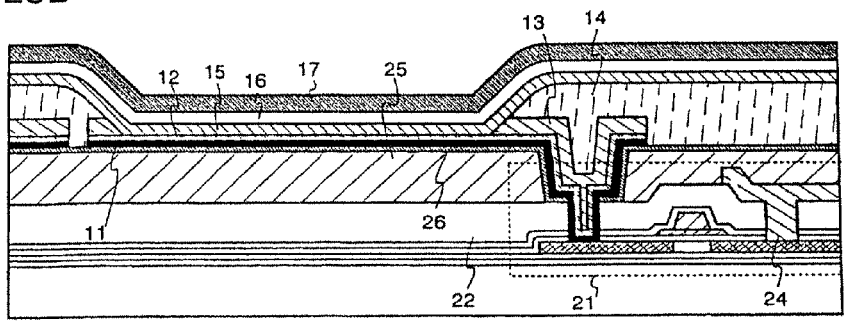

The structure shown in FIG. 23B is presented as an example where the barrier layer is formed in a position different from that of FIG. 23A, which is characterized in that the barrier layer is formed so as to cover the upper surface of the planarization layer 25 and the side surface of the second opening. With this structure, the planarization layer 25 can be sealed with the insulating layer 22 and the barrier layer 26, so that the influence of degassing can be further suppressed.

Figure 23C:
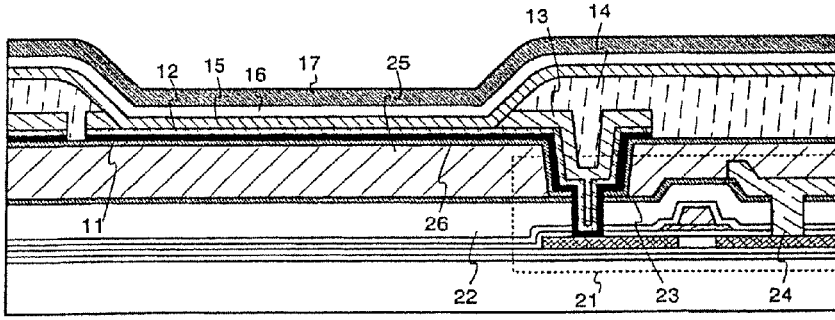

The structure shown in FIG. 23C relates to the combination of the structures of FIGS. 23A and 23B. In the structure, the barrier layer 23 is formed in contact with the lower surface of the planarization layer 25 and barrier layer 26 is formed in contact with the upper surface thereof. With this structure, the planarization layer 25 can be sealed with the barrier layers 23 and 26, so that the influence of degassing can be further suppressed.

Note that this embodiment is achieved by partially modifying the structure of Embodiment 16, which not impairs the effects of Embodiment 16, but can achieve the similar effects. Also, this embodiment can be combined with Embodiments 4 to 7.

Embodiment 20

In this embodiment, an example where a size of the first opening is made larger than that of the second opening in the structure of Embodiment 2 is shown. In other words, after forming the insulating layer 111, the insulating layer 111 and the gate insulating film 108 are etched to form the first opening, and the planarization layer 301 is formed thereon. Further, the planarization layer 301 is etched to form the second opening inside the first opening to expose the active layer (source region 104). After the barrier layer 302 is formed so as to cover the second opening, a third opening is formed in a portion of the barrier layer 302 at the bottom portion of the second opening. Accordingly, the data wirings 151 are connected through the third opening to the source region 104.

When using the structure of this embodiment, in etching the planarization layer 301, the insulating layer 111 and the gate insulating film 108 are not exposed to etchant. In particular, the above structure is effective when an inorganic insulating film such as an SOG film is used for the planarization layer 301, since the insulating layer 111 and the gate insulating film 108 are not needed to be etched. Also, if using the SOG film for the planarization layer 301, it is possible to avoid the occurrence of a phenomenon (called poisoned via) in which moisture emitted from the planarization layer causes the wiring materials to corrode.

Note that this embodiment can be combined not only with the structure of Embodiment 1 but also with those of Embodiments 2 to 11, and 16 to 18.

Embodiment 21

Figure 26A:
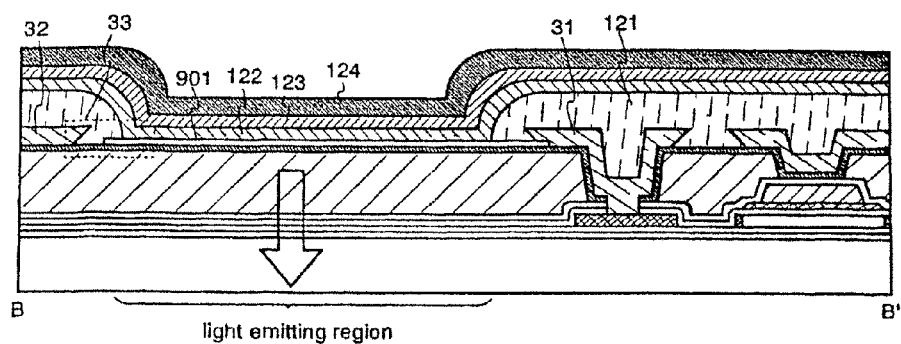
FIGS. 26A and 26B are sectional views for showing a device structure of a display device.
Figure 26B:
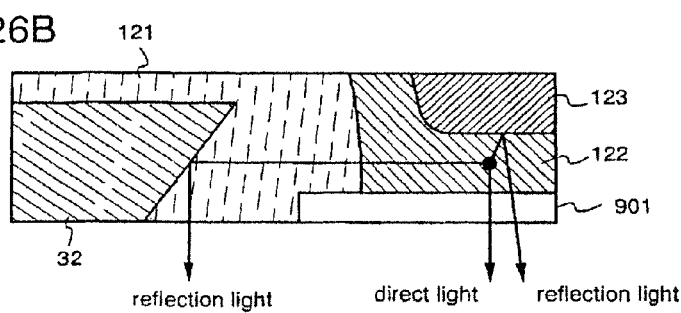

In this embodiment, an example where the shape of the etched section of the drain electrode differs from the shape of Embodiment 9 is shown. That is, as shown in FIGS. 26A and 26B, as the characteristics of this embodiment, the section in etching takes a reversely tapered shape. In FIG. 26A, reference numerals 31 and 32 denote a drain electrode and a power supply wiring for an adjacent pixel, respectively. FIG. 26B is an enlarged view of a region 33 surrounded by the dotted line of FIG. 26A.

As shown in FIG. 26B, the light emitted from the light emitting member 122 is classified into the direct light, the reflection light reflected by the cathode 123, and the reflection light reflected by the power supply wiring 32. Those lights can be recognized by an observer. In this way, an increase in efficiency in taking out the light is achieved as an effect of this embodiment.

Note that, this embodiment can be combined not only with the structure of Embodiment 9 but also with those of Embodiments 4 to 6, 8, and 10.

Embodiment 221

Figure 27A:
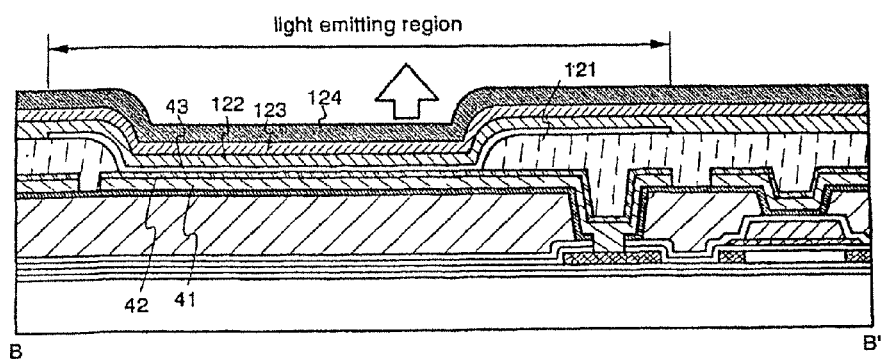
FIGS. 27A and 27B are sectional views for showing a device structure of a display device.

In this embodiment, an example in which the structure of the pixel electrode differs from that of Embodiment 2 is shown. That is, as shown in FIG. 27A, the laminate electrode composed of the first metallic film (preferably, aluminum film) 41 and the second metallic film (preferably, titanium nitride film) 42 is formed as the pixel electrode. The photosensitive organic resin film 121 is formed so as to cover the end portions thereof, on which the oxide conductive film (preferably, ITO film) 43 is formed. Thus, the finally defined light emitting region corresponds to a contact portion between the oxide conductive film 43 and the light emitting member 122.

Figure 27B:
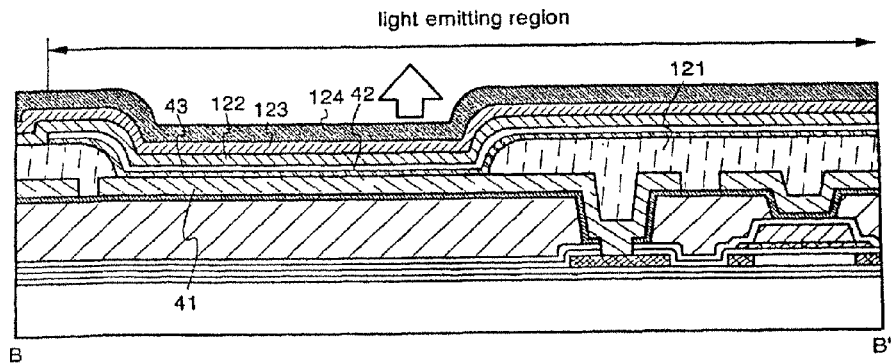

Also, the structure shown in FIG. 27B is presented as an example where the second metallic film 42 is formed after forming the photosensitive organic resin film 121 and the oxide conductive film 43 and the second metallic film 42 are laminated as shown in FIG. 27A. In this case, the finally defined light emitting region corresponds to a contact portion between the second metallic film 42 and the oxide conductive film 43 and almost the entire region in the pixel can be used as the light emitting region.

As described above, according to this embodiment, the pixel area can be effectively used and the opening ratio can be increased, thereby achieving the high-luminance display. Also, the luminance as high as the conventional ones realize is obtained with less power consumption, so that the highly reliable display device can be provided.

Note that this embodiment can be implemented in combination with the device structures described in Embodiments 1 to 3 (structures before the pixel electrode is formed) as well as the structures of Embodiments 4 to 6.

Embodiment 23

The structures of the thin film transistor described in Embodiments 1 to 22 all become top-gate structures (specifically, planar structures). In each embodiment (except Embodiment 6), however, a bottom-gate structure (typically, reverse stagger structure) can be adopted as well. Moreover, the application thereof is not limited to the thin film transistor but may be made of a MOS transistor formed by using silicon well.

Embodiment 24

The display devices shown in Embodiments 1 to 22 each exemplify an electroluminescence display device. However, the device structure itself (before the pixel electrode is formed) is similar to the case of applying the device structure to a liquid crystal display device. In addition, the device structure may be applied to the display devices such as the liquid crystal display device and the field emission display device.

Embodiment 25

In this embodiment, a structure of the entire electroluminescence display device to which the present invention is applicable will be described with FIGS. 28A to 28D. FIG. 28A is a top view of an electroluminescence display device formed by sealing an element substrate in which thin film transistors are formed with a sealing material. FIG. 28B is a cross sectional view along a line B-B' in FIG. 28A. FIG. 28C is a cross sectional view along a line A-A' in FIG. 28A.

A pixel portion (display portion) 202, a data line driver circuit 203, gate line driver circuits 204a and 204b, and a protective circuit 205, which are provided to surround the pixel portion 202, are all located on a substrate 201, and a seal material 206 is provided to surround all these. The structure of the pixel portion 202 preferably refers to Embodiments 1 to 23 and the description thereof. As the seal material 206, a glass material, a metallic material (typically, a stainless material), a ceramic material, or a plastic material (including a plastic film) can be used. As shown in Embodiments 1 to 24, it can be also sealed with only an insulating film. In addition, it is necessary to use a translucent material according to a radiation direction of light from an EL element.

The seal material 206 may be provided to partially overlap with the data line driver circuit 203, the gate line driver circuits 204a and 204b, and the protective circuit 205. A sealing material 207 is provided using the seal material 206, so that a closed space 208 is formed by the substrate 201, the seal material 206, and the sealing material 207. A hygroscopic agent (barium oxide, calcium oxide, or the like) 209 is provided in advance in a concave portion of the sealing material 207, so that it has a function of absorbing moisture, oxygen, and the like to keep an atmosphere clean in an inner portion of the above closed space 208, thereby suppressing the deterioration of an EL layer. The concave portion is covered with a cover material 210 with a fine mesh shape. The cover material 210 allows air and moisture to pass therethrough but not the hygroscopic agent 209. Note that the closed space 208 is preferably filled with a noble gas such as nitrogen or argon, and can be also filled with a resin or a liquid if it is inert.

Also, an input terminal portion 211 for transmitting signals to the data line driver circuit 203 and the gate line driver circuits 204a and 204b is provided on the substrate 201. Data signals such as video signals are transferred to the input terminal portion 211 through a FPC (flexible printed circuit) 212. With respect to a cross section of the input terminal portion 211, as shown in FIG. 28B, an input wiring having a structure in which an oxide conductive film 214 is laminated on a wiring 213 formed together with a gate wiring or a data wiring is electrically connected with a wiring 215 provided in the FPC 212 side through a resin 217 to which conductors 216 are dispersed. Note that a spherical polymer compound for which plating processing using gold or silver is conducted is preferably used for the conductors 216.

Also, an enlarged view of a region 218 surrounded by a dot line in FIG. 28C is shown in FIG. 28D. The protective circuit 205 is preferably composed by combining a thin film transistor 219 and a capacitor 220, and any known structure may be used therefor. The present invention has such a feature that the formation of the capacitor is possible without increasing the number of photolithography steps together with the improvement of contact holes. In this embodiment, the capacitor 220 is formed utilizing the feature. Note that the structure of the thin film transistor 219 and that of the capacitor 220 can be understood by referring with Embodiment 1 and description thereof, and therefore the description is omitted here.

In this embodiment, the protective circuit 205 is provided between the input terminal portion 211 and the data line driver circuit 203. When an electrostatic signal such as an unexpected pulse signal is inputted therebetween, the protective circuit releases the pulse signal to the outside. At this time, first, a high voltage signal which is instantaneously inputted can be dulled by the capacitor 220, and other high voltages can be released to the outside through a circuit composed of a thin film transistor and a thin film diode. Of course, the protective circuit may be provided in other location, for example, a location between the pixel portion 202 and the data line driver circuit 203 or locations between the pixel portion 202 and the gate line driver circuits 204a and 204b.

As described above, according to this embodiment, when the present invention is carried out, an example in which the capacitor used for the protective circuit for electrostatic measures and the like which is provided in the input terminal portion is simultaneously formed is indicated. This embodiment can be carried out by being combined with any structure of Embodiments 1 to 23.

Embodiment 26

Examples of electronic apparatuses employing a display device of the present invention to a display portion therein can be given as a video camera, a digital camera, a goggle type display (head mounted display), a navigation system, an audio reproducing apparatus (car audio, an audio component, and the like), a laptop computer, a game machine, a portable information terminal (a mobile computer, a cellular phone, a portable game machine, an electronic book, etc.), and an image reproducing apparatus including a recording medium (specifically, an apparatus capable of processing data in a recording medium such as a Digital Versatile Disk (DVD) and having a display that can display the image of the data). Practical examples thereof are shown in FIGS. 29A to 2911

Figure 29A:
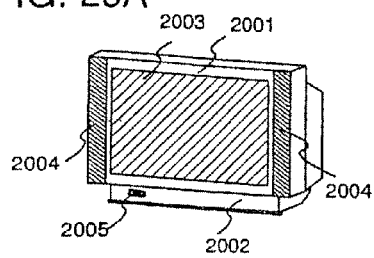
FIGS. 29A to 29H each show an example of electronic apparatuses.

FIG. 29A shows a television, which comprises a casing 2001, a supporting base 2002, a display portion 2003, speaker units 2004, a video input terminal 2005, etc. The present invention is applied to the display portion 2003. The term television includes every television for displaying information such as one for a personal computer, one for receiving TV broadcasting, and one for advertisement.

Figure 29B:
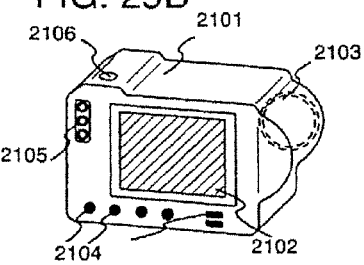

FIG. 29B shows a digital camera, which comprises a main body 2101, a display portion 2102, an image receiving unit 2103, operation keys 2104, an external connection port 2105, a shutter 2106, etc. The present invention is applied to the display portion 2102.

Figure 29C:
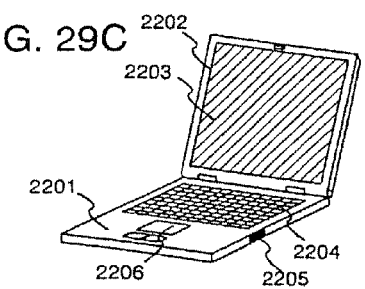

FIG. 29C shows a laptop computer, which comprises a main body 2201, a casing 2202, a display portion 2203, a keyboard 2204, an external connection port 2205, a pointing mouse 2206, etc. The present invention is applied to the display portion 2203.

Figure 29D:
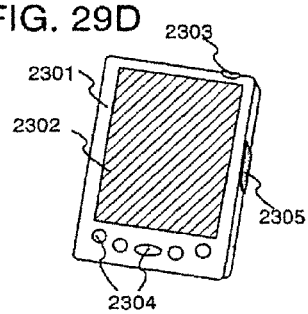

FIG. 29D shows a mobile computer, which comprises a main body 2301, a display portion 2302, a switch 2303, operation keys 2304, an infrared ray port 2305, etc. The present invention is applied to the display portion 2302.

Figure 29E:
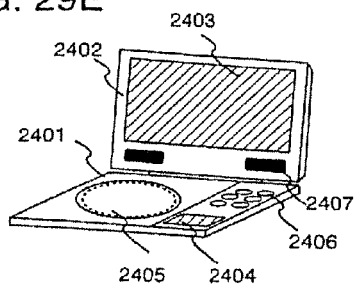

FIG. 29E shows a portable image reproducing apparatus equipped with a recording medium (a DVD player, to be specific). The apparatus comprises a main body 2401, a casing 2402, a display portion A 2403, a display portion B 2404, a recording medium (such as DVD) reading unit 2405, operation keys 2406, speaker units 2407, etc. The display portion A 2403 mainly displays image information whereas the display portion B 2404 mainly displays text information. The present invention is applied to the display portions A 2403 and B 2404. The term image reproducing apparatus equipped with a recording medium includes domestic game machines.

Figure 29F:
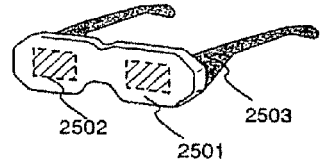

FIG. 29F shows a goggle type display (head mounted display), which comprises a main body 2501, display portions 2502, and arm units 2503. The present invention is applied to the display portion 2502.

Figure 29G:
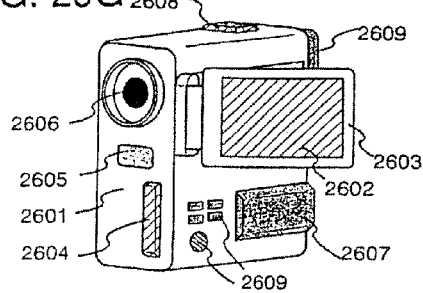

FIG. 29G shows a video camera, which comprises a main body 2601, a display portion 2602, a casing 2603, an external connection port 2604, a remote control receiving unit 2605, an image receiving unit 2606, a battery 2607, an audio input unit 2608, operation keys 2609, etc. The present invention is applied to the display portion 2602.

Figure 29H:
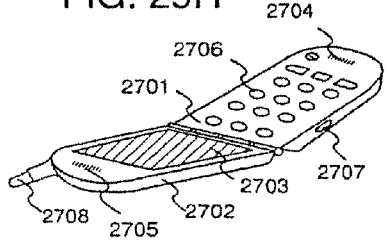

FIG. 29H shows a cellular phone, which comprises a main body 2701, a casing 2702, a display portion 2703, an audio input unit 2704, an audio output unit 2705, operation keys 2706, an external connection port 2707, an antenna 2708, etc. The present invention is applied to the display portion 2703.

If the display portion 2703 displays white characters on a black background, power consumption of the cellular phone can be reduced.

As described above, the display device obtained by implementing the present invention may be used as the display portions of any electronic apparatus. The electronic apparatuses of the present Embodiment may use any structure of the display device shown in Embodiments 1 to 25.

Consequently, the display device is formed based on the device structure according to the present invention, whereby the influence of the plasma damage can be reduced in the manufacturing steps thereof, the variations of the threshold voltage of the transistors can be suppressed, and the display device having the uniform display characteristics can be obtained.

What is claimed is:
1. A display device comprising:
a first insulating film comprising nitrogen;
a second insulating film over the first insulating film, the second insulating film comprising oxygen;
a first semiconductor film over the second insulating film;
a third insulating film over the first semiconductor film, the third insulating film comprising oxygen;
a first conductive film over the first semiconductor film with the third insulating interposed between the first conductive film and the first semiconductor film;
a fourth insulating film over the first conductive film, the fourth insulating film comprising nitrogen;
a second conductive film over the first conductive film with the fourth insulating film interposed between the first conductive film and the second conductive film;
a fifth insulating film over the fourth insulating film, the fifth insulating film being an inorganic insulating film;
a third conductive film over the fifth insulating film;
a planarization layer over the third conductive film;
a pixel electrode over the planarization layer;
an organic resin film over the pixel electrode;
a light-emitting member over the pixel electrode and the organic resin film; and
an opposing electrode over the light-emitting member,
wherein the fifth insulating film comprises a first opening,
wherein the planarization layer comprises a second opening,
wherein the organic resin film comprises a third opening,
wherein an edge portion of the second opening is rounded,
wherein an edge portion of the third opening is rounded,
wherein part of the third conductive film and part of the planarization layer are located in the first opening,
wherein part of the pixel electrode and part of the organic resin film are located in the second opening, and
wherein part of the light-emitting member and part of the opposing electrode are located in the third opening.

2. The display device according to claim 1, wherein the first insulating film comprises oxygen.

3. The display device according to claim 1, wherein the second insulating film comprises nitrogen.

4. The display device according to claim 1, wherein the first semiconductor film is an active layer of an n-channel type transistor.

5. The display device according to claim 1, wherein the third insulating film comprises nitrogen.

6. The display device according to claim 1, wherein the first conductive film is a tantalum nitride film or a tungsten film.

7. The display device according to claim 1, wherein the second conductive film is located over the fifth insulating film.

8. The display device according to claim 1, wherein the fifth insulating film is a planarized insulating film.

9. The display device according to claim 1, wherein the third conductive film comprises aluminum or copper.

10. The display device according to claim 1, wherein the planarization layer is an inorganic insulating film.

11. The display device according to claim 1, comprising a second semiconductor film over the second insulating film,
wherein the third conductive film is in contact with the second semiconductor film.

12. The display device according to claim 1, wherein a capacitor is formed by the first semiconductor film, the third insulating film, and the first conductive film.

13. A display device comprising:
a first insulating film comprising nitrogen;
a second insulating film over the first insulating film, the second insulating film comprising oxygen;
a first semiconductor film over the second insulating film;
a third insulating film over the first semiconductor film, the third insulating film comprising oxygen;
a first conductive film over the first semiconductor film with the third insulating interposed between the first conductive film and the first semiconductor film;
a fourth insulating film over the first conductive film, the fourth insulating film comprising nitrogen;
a second conductive film over the first conductive film with the fourth insulating film interposed between the first conductive film and the second conductive film;
a fifth insulating film over the fourth insulating film, the fifth insulating film being an inorganic insulating film;
a third conductive film over the fifth insulating film;
a planarization layer over the third conductive film;
a pixel electrode over the planarization layer;
an organic resin film over the pixel electrode;
a light-emitting member over the pixel electrode and the organic resin film; and
an opposing electrode over the light-emitting member,
wherein the fifth insulating film comprises a first opening,
wherein the planarization layer comprises a second opening,
wherein the organic resin film comprises a third opening,
wherein an edge portion of the second opening is rounded,
wherein an edge portion of the third opening is rounded,
wherein part of the third conductive film and part of the planarization layer are located in the first opening,
wherein part of the pixel electrode and part of the organic resin film are located in the second opening,
wherein part of the light-emitting member and part of the opposing electrode are located in the third opening, and
wherein a first capacitor is formed by the first conductive film, the fourth insulating film, and the second conductive film.

14. The display device according to claim 13, wherein the first insulating film comprises oxygen.

15. The display device according to claim 13, wherein the second insulating film comprises nitrogen.

16. The display device according to claim 13, wherein the first semiconductor film is an active layer of an n-channel type transistor.

17. The display device according to claim 13, wherein the third insulating film comprises nitrogen.

18. The display device according to claim 13, wherein the first conductive film is a tantalum nitride film or a tungsten film.

19. The display device according to claim 13, wherein the second conductive film is located over the fifth insulating film.

20. The display device according to claim 13, wherein the fifth insulating film is a planarized insulating film.

21. The display device according to claim 13, wherein the third conductive film comprises aluminum or copper.

22. The display device according to claim 13, wherein the planarization layer is an inorganic insulating film.

23. The display device according to claim 13, comprising a second semiconductor film over the second insulating film,
wherein the third conductive film is in contact with the second semiconductor film.

24. The display device according to claim 13, wherein a second capacitor is formed by the first semiconductor film, the third insulating film, and the first conductive film.

25. A display device comprising:
a first insulating film comprising nitrogen;
a second insulating film over the first insulating film, the second insulating film comprising oxygen;
a first semiconductor film over the second insulating film;
a third insulating film over the first semiconductor film, the third insulating film comprising oxygen;
a first conductive film over the first semiconductor film with the third insulating interposed between the first conductive film and the first semiconductor film;
a fourth insulating film over the first conductive film, the fourth insulating film comprising nitrogen;
a second conductive film over the first conductive film with the fourth insulating film interposed between the first conductive film and the second conductive film;
a fifth insulating film over the fourth insulating film, the fifth insulating film being an inorganic insulating film;
a third conductive film over the fifth insulating film;
a planarization layer over the third conductive film;
a pixel electrode over the planarization layer;
an organic resin film over the pixel electrode;
a light-emitting member over the pixel electrode and the organic resin film; and
an opposing electrode over the light-emitting member,
wherein the fifth insulating film comprises a first opening,
wherein the planarization layer comprises a second opening,
wherein the organic resin film comprises a third opening,
wherein an edge portion of the second opening is rounded,
wherein an edge portion of the third opening is rounded,
wherein part of the third conductive film and part of the planarization layer are located in the first opening,
wherein part of the pixel electrode and part of the organic resin film are located in the second opening,
wherein part of the light-emitting member and part of the opposing electrode are located in the third opening, and
wherein a bottom of the first opening and a bottom of the second opening are not overlapped with each other.

26. The display device according to claim 25, wherein the first insulating film comprises oxygen.

27. The display device according to claim 25, wherein the second insulating film comprises nitrogen.

28. The display device according to claim 25, wherein the first semiconductor film is an active layer of an n-channel type transistor.

29. The display device according to claim 25, wherein the third insulating film comprises nitrogen.

30. The display device according to claim 25, wherein the first conductive film is a tantalum nitride film or a tungsten film.

31. The display device according to claim 25, wherein the second conductive film is located over the fifth insulating film.

32. The display device according to claim 25, wherein the fifth insulating film is a planarized insulating film.

33. The display device according to claim 25, wherein the third conductive film comprises aluminum or copper.

34. The display device according to claim 25, wherein the planarization layer is an inorganic insulating film.

35. The display device according to claim 25, comprising a second semiconductor film over the second insulating film,
   wherein the third conductive film is in contact with the second semiconductor film.

36. The display device according to claim 25, wherein a capacitor is formed by the first semiconductor film, the third insulating film, and the first conductive film.

* * * * *

UNITED STATES PATENT AND TRADEMARK OFFICE
CERTIFICATE OF CORRECTION

PATENT NO. : 9,165,991 B2 Page 1 of 1
APPLICATION NO. : 14/588771
DATED : October 20, 2015
INVENTOR(S) : Shunpei Yamazaki et al.

It is certified that error appears in the above-identified patent and that said Letters Patent is hereby corrected as shown below:

In the Specification:

Col. 1, line 45, "development)" should read --development,--

Col. 2, line 21, "Planarization" should read --planarization--

Col. 4, line 45, "harrier" should read --barrier--

Col. 10, line 19, "TFT), TFT 155" should read --TFT), a TFT 155--

Col. 14, lines 26-27, "coverage, at the time" should read --coverage at the time--

Col. 16, line 8, "driving to" should read --driving TFT to--

Col. 18, line 14, "Thai is," should read --That is,--

Col. 19, line 40, "p-channel in" should read --p-channel TFT in--

Col. 20, line 5, "patent application" should read --Patent Application--

Col. 21, line 4, "1801)," should read --1801).--

Col. 21, line 16, "Embodiment 16," should read --Embodiment 16.--

Col. 22, line 61, "Embodiment 221" should read --Embodiment 22--

Col. 25, line 19, "to 2911" should read --to 29H.--

Signed and Sealed this
Twenty-ninth Day of March, 2016

Michelle K. Lee
*Director of the United States Patent and Trademark Office*